United States Patent
Endoh et al.

(10) Patent No.: US 9,466,607 B2
(45) Date of Patent: *Oct. 11, 2016

(54) SEMICONDUCTOR INTEGRATED CIRCUIT AND METHOD OF PRODUCING THE SAME

(71) Applicant: TOHOKU UNIVERSITY, Sendai-shi, Miyagi (JP)

(72) Inventors: Tetsuo Endoh, Sendai (JP); Seo Moon-Sik, Sendai (JP)

(73) Assignee: TOHOKU UNIVERSITY, Sendai-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/880,690

(22) Filed: Oct. 12, 2015

(65) Prior Publication Data

US 2016/0104714 A1 Apr. 14, 2016

Related U.S. Application Data

(62) Division of application No. 14/600,554, filed on Jan. 20, 2015, now Pat. No. 9,184,171, which is a division of application No. 13/697,905, filed as application No. PCT/JP2011/061066 on May 13, 2011, now Pat. No. 8,969,944.

(30) Foreign Application Priority Data

May 14, 2010 (JP) .................................. 2010-112705

(51) Int. Cl.
*H01L 31/119* (2006.01)
*H01L 27/115* (2006.01)
(Continued)

(52) U.S. Cl.
CPC ..... *H01L 27/11556* (2013.01); *G11C 16/0425* (2013.01); *G11C 16/0433* (2013.01);
(Continued)

(58) Field of Classification Search
CPC ................................................ H01L 27/11556

USPC ................ 257/295, 314–316, 324–326, 328; 438/257–258, 593, 268, 478
See application file for complete search history.

(56) References Cited

U.S. PATENT DOCUMENTS 8,338,876 B2    12/2012   Kito et al.
8,969,944 B2 *   3/2015   Endoh ................ G11C 16/0425
                                                  257/295

(Continued)

FOREIGN PATENT DOCUMENTS

CN     101626023 A    1/2010
JP      2003-7866 A    1/2003

(Continued)

OTHER PUBLICATIONS

International Search Report of PCT/JP2011/061066, date of mailing Aug. 16, 2011.

(Continued)

*Primary Examiner* — Dung Le
(74) *Attorney, Agent, or Firm* — Westerman, Hattori, Daniels & Adrian, LLP

(57) ABSTRACT

Provided is a semiconductor integrated circuit that uses a novel vertical MOS transistor that is free of interference between cells, that enables the short-channel effect to be minimized, that does not have hot electron injection, and that does not require the formation of shallow junction. Also provided is a method of producing the semiconductor integrated circuit. A memory cell 1 in the semiconductor integrated circuit is provided with: a semiconductor pillar 2 that serves as a channel; a floating gate 5 that circumferentially covers the semiconductor pillar 2 via a tunnel insulation layer 6 on the outer circumference of the semiconductor pillar 2; and a control gate 4 that circumferentially covers the semiconductor pillar via an insulating layer 8 on the outer circumference of the semiconductor pillar 2, and that circumferentially covers the floating gate 5 via an insulating layer 7 on the outer circumference of the floating gate.

16 Claims, 60 Drawing Sheets

(51) Int. Cl.
*G11C 16/04* (2006.01)
*H01L 29/788* (2006.01)
*H01L 27/088* (2006.01)
*H01L 29/66* (2006.01)
*H01L 29/423* (2006.01)

(52) U.S. Cl.
CPC ......... *G11C16/0483* (2013.01); *H01L 27/088* (2013.01); *H01L 27/11524* (2013.01); *H01L 27/11551* (2013.01); *H01L 29/42328* (2013.01); *H01L 29/66477* (2013.01); *H01L 29/66825* (2013.01); *H01L 29/7883* (2013.01); *H01L 29/7889* (2013.01)

(56) References Cited

U.S. PATENT DOCUMENTS

| | | |
|---|---|---|
| 2010/0006919 A1 | 1/2010 | Kim et al. |
| 2010/0078701 A1 | 4/2010 | Shim et al. |
| 2010/0118610 A1 | 5/2010 | Katsumata et al. |
| 2011/0127597 A1 | 6/2011 | Fukuzumi et al. |

FOREIGN PATENT DOCUMENTS

| | | |
|---|---|---|
| JP | 2006-24930 A | 1/2006 |
| JP | 2006-332641 A | 12/2006 |
| JP | 2007-180241 A | 7/2007 |
| TW | 200721395 | 6/2007 |
| WO | 2006/132158 A1 | 12/2006 |

OTHER PUBLICATIONS

Endoh, T. et al., "Novel Ultra High Density Flash Memory with A Stacked-Surrounding Gate Transistor (S-SGT) Structured Cell", IEDM Tech Dig., 2001, pp. 33-36; Cited in Specification (4 pages).

Tanaka, H. et al., "Bit Cost Scalable Technology with Punch and Plug Process for Ultra High Density Flash Memory", Symposium on VLSI Technology Digest of Technical Papers, 2007, pp. 14-15; (2 pages).

Fukuzumi, Y. et al., "Optimal Integration and Characteristics of Vertical Array Devices for Ultra-High Density, Bit-Cost Scalable Flash Memory", IEEE, 2007, pp. 449-452; (4 pages).

Komori, Y., "Disturbless Flash Memory due to High Boost Efficiency on BiCS Structure and Optimal Memory Film Stack for Ultra High Density Storage Device", IEDM Tech. Dig., 2008, pp. 851-854; (4 pages).

Katsumata, R. et al., "Pipe-shaped BiCS Flash Memory with 16 Stacked Layers and Multi-Level-Cell Operation for Ultra High Density Storage Devices", Symposium on VLSI Technology Digest of Technical Papers, 2009, pp. 136-137; (2 pages).

Jaehoon Jang, H. K. et al., "Vertical Cell Array using TCAT (Terabit Cell Array Transistor) Technology for Ultra High Density NAND Flash Memory", Symposium on VLSI Technology Digest of Technical Papers, 2009, pp. 192-193; (2 pages).

Japanese Office Action dated Jul. 1, 2014, issued in Japanese Patent Application No. 2012-514874, w/English translation (6 pages).

Japanese Office Action dated Dec. 2, 2014, issued in Japanese Patent Application No. 2012-514874, w/partial English translation (4 pages).

Office Action dated Jun. 15, 2015, issued in counterpart Taiwanese application No. 100117024 (17 pages).

\* cited by examiner

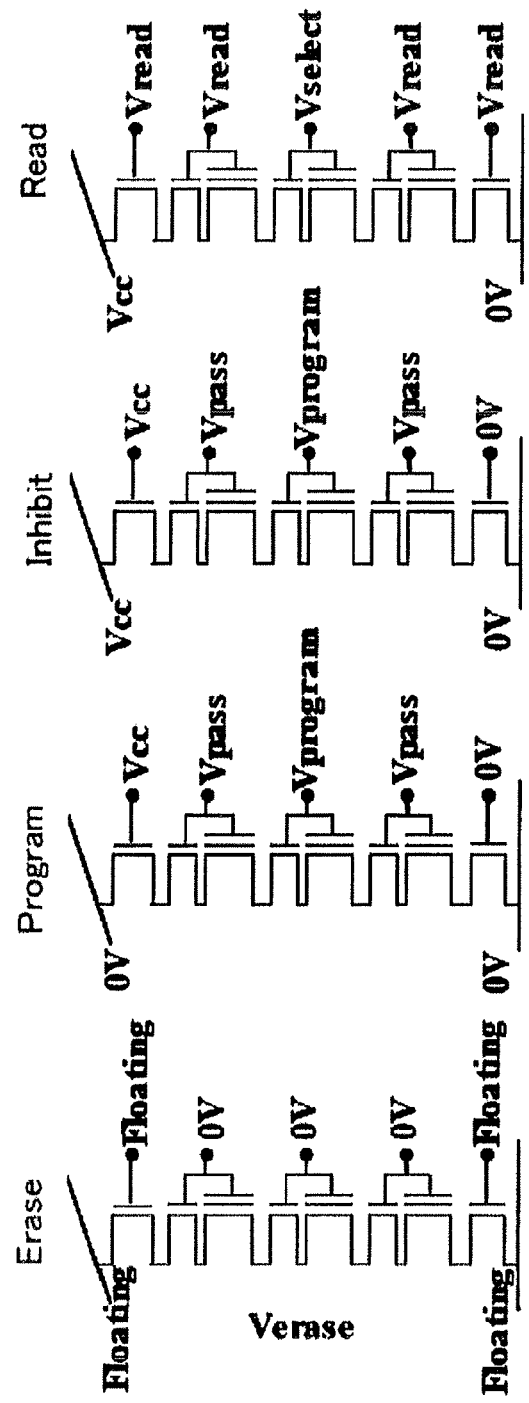

Distance from surface of p-type semiconductor pillar($\mu$ m)

Diameter of the p-type semiconductor pillar (nm)

Direct Coupling

Indirect Coupling

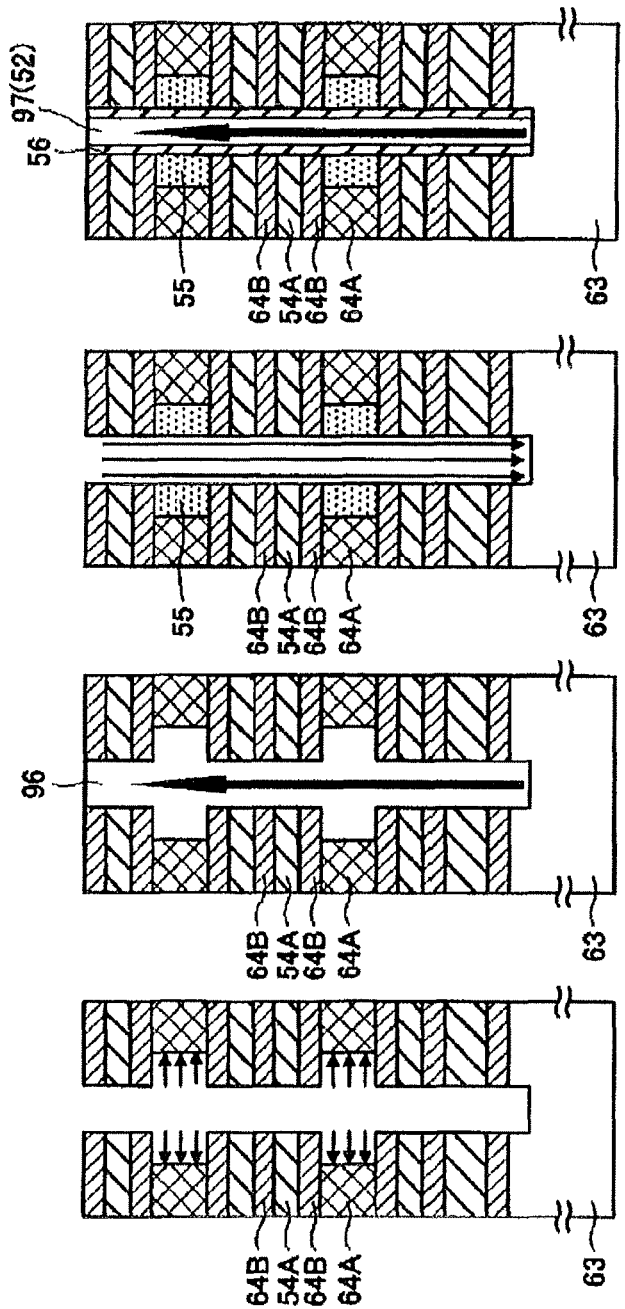

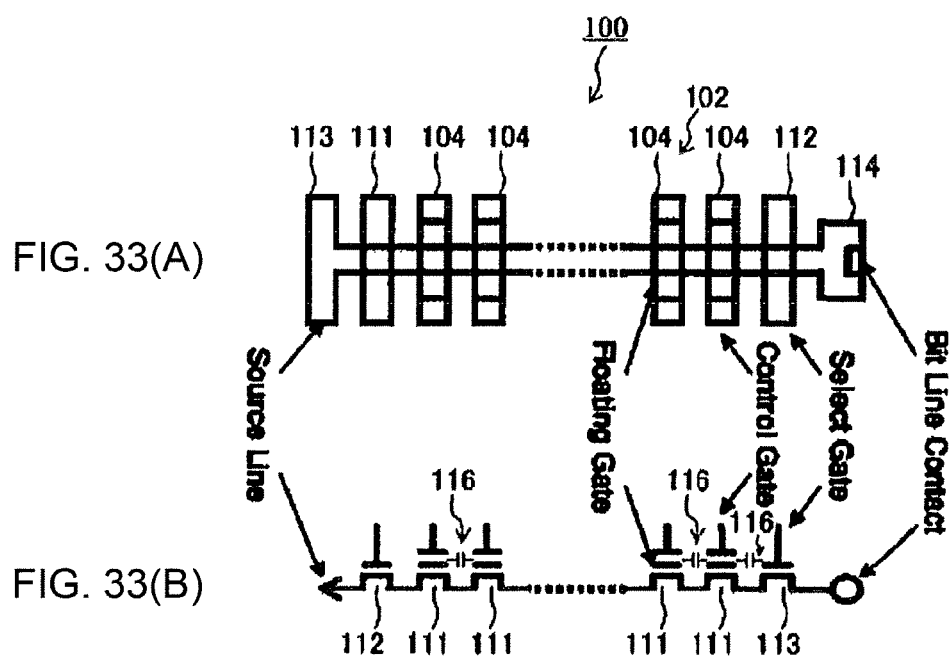

SEMICONDUCTOR INTEGRATED CIRCUIT AND METHOD OF PRODUCING THE SAME

CROSS-REFERENCE TO RELATED APPLICATIONS

This is a divisional application of U.S. patent application Ser. No. 14/600,554 filed on Jan. 20, 2015, which is a divisional application of U.S. patent application Ser. No. 13/697,905 filed on Jan. 28, 2013, which is a 371 of International Application No. PCT/JP2011/061066, filed on May 13, 2011, which claims the benefit of priority from the prior Japanese Patent Application No. 2010-112705, filed on May 14, 2010, the entire contents of which are incorporated herein by reference.

TECHNICAL FIELD

The present invention relates to a semiconductor integrated circuit including a memory cell and the method of producing the same.

BACKGROUND ART

With regard to conventional NAND-type memories, the high integration by miniaturization has been limited mainly due to the following reasons. The first reason is that a shorter channel length causes a phenomenon in which current tends to occur between a source and a drain even when the gate voltage is equal to or lower than a threshold voltage (i.e., a so-called short channel effect), thus resulting in a fluctuated threshold voltage. The second reason is that a source or a drain having a shallow junction is difficult to be formed. The third reason is that the hot electrons during writing (or during programming) are injected to a floating gate to cause the fluctuation in the threshold voltage of the transistor. The fourth reason is that the interference between cells is caused by the capacitive coupling between cells adjacent to each other for example.

FIGS. 33(A) and 33(B) are views showing the basic structure of a conventional NAND-type flash memory. FIG. 33(A) shows a plane pattern. FIG. 33(B) shows an equivalent circuit.

As shown in FIGS. 33(A) and 33(B), the conventional NAND-type flash memory 100 has a NAND string 102 that is composed of: series-connected NAND-type flash memory cells 104; a first select gate transistor 111 connected to one end of the flash memory cells 104; and a second select gate transistor 112 connected to the other end of the flash memory cells 104. The first select gate transistor 111 is connected to a source line. The second select gate transistor 112 is connected to a bit line.

Flash memory cells adjacent to each other have a capacitive coupling at a parasitic capacitance 116, thereby causing the interference between the flash memory cells 104. A current approach is that the first select gate transistor 111 and the second select gate transistor 112 have a channel length longer than that of the flash memory cells 104 to thereby avoid the hot electron injection.

In order to solve the limitation on the conventional NAND-type flash memory as described above, Non-patent Literature 1 discloses a vertical memory cell array using vertical memory cells having a higher integration degree than that of a two-dimensional integrated circuit. This vertical memory cell uses a floating gate structure for nonvolatile storage.

In the memory cell of the floating gate structure, a floating gate composed of poly Si has a barrier height of 3.15 eV. Thus, high reliability is obtained for storage and a high integration degree also can be obtained. However, neighboring cells (cells adjacent to each other in the vertical direction in particular) have capacitive coupling to cause an intercell interference, which makes it difficult to improve the writing rate of the memory cell.

Furthermore, various elements using charge trap vertical memory cells instead of the floating gate structure have been disclosed as BiCS (see Non-patent Literature 1 and Non-patent Literature 2), p-BiCS (see Non-patent Literature 3 and Non-patent Literature 4), and TCATCS (see Non-patent Literature 5).

However, the charge trap-type vertical memory cell has a disadvantage in the storage reliability. This disadvantage is due to that the storage by the charge trap-type memory cell is retained by the trap charges in the insulator and has a low barrier height of 1.0 eV for example. Furthermore, in the case of this conventional technique, it is difficult to suppress a short channel effect or form the shallow source or drain junction, thus has a difficulty in solving the disadvantage due to the hot electron injection during writing (or during programming). Furthermore, the control of the charge amount to be stored is difficult and the storage of a plurality of pieces of bit information in one memory cell is also difficult.

CITATION LIST

Non-Patent Literature

Non-patent Literature 1: T. Endoh, et al, IEDM Tech. Dig., pp 33-36, 2001.
Non-patent Literature 2: H. Tanaka, et al, VLSI Symp. Tech. Dig., pp 14-15, 2007
Non-patent Literature 3: Y. Fukuzumi, et al., IEDM Tech. Dig., pp 449-452, 2007.
Non-patent Literature 4: Y. Komori, et al., IEDM Tech. Dig., pp 851-854, 2008.
Non-patent Literature 5: R. Katsumata, et al, VLSI Symp. Tech. Dig., pp 136-137, 2009
Non-patent Literature 6: J. H. Jang, et al, VLSI Symp. Tech. Dig., pp 192-193, 2009

SUMMARY OF INVENTION

Technical Problem

In the case of the conventional plane flash memory or vertical memory cell, limitation has been caused as described above on the miniaturization due to causing factors including the difficulty in the suppression of the short channel effect, the difficulty in the realization of a shallow junction, the malfunction caused by the hot electron injection during programming, and the intercell interference caused by the capacitive coupling of neighboring memory cells.

In view of the above situation, the first objective of the present invention is to provide a semiconductor device comprising memory cells using such a vertical MOS transistor having a new floating gate structure that suppresses the short channel effect, that suppresses the transistor failure caused by the hot electron injection, and that is free from an intercell interference. The second objective is to provide the production method thereof.

The third objective of the present invention is to provide a semiconductor device comprising memory cells using multiple levels per cell and using such a vertical MOS transistor having a new floating gate structure that suppresses the short channel effect, that suppresses the transistor failure caused by the hot electron injection, and that is free from an intercell interference. The fourth objective is to provide the production method thereof.

Solution to Problem

In order to achieve the first objective, a semiconductor integrated circuit of the present invention includes a memory cell, wherein the memory cell includes: a semiconductor pillar that serves as a channel; a floating gate that circumferentially covers the side face of the semiconductor pillar or covers a part thereof via an insulating layer on the outer circumference of the semiconductor pillar; and a control gate that circumferentially covers the side face of the semiconductor pillar or covers a part thereof via an insulating layer on the outer circumference of the semiconductor pillar and that circumferentially covers the side face of the floating gate or covers a part thereof via an insulating layer on the outer circumference of the floating gate.

A semiconductor integrated circuit of the present invention includes: a memory cell, wherein the memory cell includes: a semiconductor pillar that serves as a channel; a floating gate that circumferentially covers the side face of the semiconductor pillar or covers a part thereof via an insulating layer on the outer circumference of the semiconductor pillar; and a control gate that circumferentially covers the side face of the semiconductor pillar or covers a part thereof via an insulating layer on the outer circumference of the semiconductor pillar and that circumferentially covers the side face of the floating gate or covers a part thereof via an insulating layer on the outer circumference of the floating gate and that covers the upper face or the lower face or a part of the upper face or the lower face of the floating gate via an insulating layer.

In the above structure, the control gate is preferably composed of a first control gate that is circumferentially provided or provided at a part of the circumference around the semiconductor pillar via the insulating layer and a second control gate that is circumferentially provided or provided at a part of the circumference around the floating gate via the insulating layer.

The control gate is preferably configured along the axial direction of the semiconductor pillar in an order of the first control gate and the second control gate, in an order of the second control gate and the first control gate, or in an order of the first control gate, the second control gate, and the first control gate.

Preferably a side section of the semiconductor pillar opposed to the control gate has an inversion layer formed by a voltage applied to the control gate.

At least one of the upper direction and the lower direction of the semiconductor pillar has any one of a source electrode and a drain electrode and hot electrons caused by an application of a voltage to the electrode may enter the control gate and not be injected to the floating gate.

The control gate is preferably configured in an integrated manner so that the second control gate sandwiches the first control gate along the axial direction of the semiconductor pillar.

The semiconductor pillar is a p-type semiconductor pillar of $1\times10^{15}$ cm$^{-3}$ or more and $1\times10^{22}$ cm$^{-3}$ or less. However, it may be an n-type pillar.

A semiconductor integrated circuit may include any of a plurality of above described memory cells, wherein the plurality of the control gates and the floating gates are provided along the respective semiconductor pillars. This structure allows NAND-type memory cell to be configured.

In the above structure, gaps or low-dielectric-constant layers are preferably inserted among neighboring regions of the plurality of memory cells.

The respective semiconductor pillars may be provided on a substrate, a first select gate transistor may be provided between the lowermost memory cell and the substrate, and a second select gate transistor may be provided between the upper parts of the uppermost memory cell.

The respective semiconductor pillars may be provided on the substrate, and a pass transistor for connecting the semiconductor pillars adjacent to each other may be formed on the substrate.

The respective semiconductor pillars may be provided on the substrate, a dummy control gate may be provided between the lowermost memory cell and the first select gate transistor provided at the lowermost side.

In order to achieve the second objective, a method of producing a semiconductor integrated circuit of the present invention, includes: a step of layering three types of different layers on a substrate; a step of providing a line and a space to this layered layers and forming an opening up to the surface of the substrate; a step of etching a region functioning as a control gate in the layers layered adjacent to the opening; a step of depositing a semiconductor material in the opening including the region functioning as a control gate; a step of subjecting a region including the deposited semiconductor material to an anisotropic etching to form an opening in a region in which a semiconductor pillar and a tunnel insulating layer are to be formed and forming a floating gate; a step of depositing a tunnel insulating layer on a side wall of the opening formed by the anisotropic etching; a step of depositing a semiconductor material on the opening surrounded by the tunnel insulating layer to form a semiconductor pillar; a step of etching the three types of different layers having etching selectivity to one another except for a layer including the floating gate and a layer functioning as a separation layer between cells; a step of forming another insulating layer on the floating gate, the layer functioning as the separation layer, and the tunnel insulating layer; a step of depositing, on the another insulating layer, a material to be used for a control gate; and a step of etching the material to be used for a control gate so as to form a control gate and a word line.

In the above structure, the semiconductor material is preferably any of poly silicon, silicon, metal, or silicide.

The material to be used for a control gate is preferably any of poly silicon, metal, or silicide.

Preferably the step of forming the three types of different layers on the substrate is performed after a step of forming a source region or a drain region on a silicon substrate as the substrate.

Preferably the substrate is performed after a step of forming a pass transistor for connecting the semiconductor pillars provided adjacent to each other.

In order to achieve the third objective, in a semiconductor integrated circuit including a memory cell of the present invention, the memory cell includes: a semiconductor pillar that serves as a channel; a floating gate that circumferentially covers the side face of the semiconductor pillar or covers a part thereof via an insulating layer on the outer circumference of the semiconductor pillar; a main control gate that circumferentially covers the side face of the floating gate or covers a part thereof via an insulating layer on the outer circumference of the floating gate; a source/drain control gate that circumferentially covers the side face of the semiconductor pillar or covers a part thereof via an insulating layer on the outer circumference of the semiconductor pillar at the upper face or the lower face of the floating gate; and an insulating layer that is provided between the floating gate and the source/drain control gate and between the main control gate and the source/drain control gate, respectively.

In the above structure, the main control gate is preferably circumferentially provided or provided at a part of the circumference around the floating gate via the insulating layer, the source/drain control gate is circumferentially provided or provided at a part of the circumference around the semiconductor pillar at the upper face or the lower face of the floating gate via the insulating layer, and the main control gate is separated from the source/drain control gate.

Preferably a side section of the semiconductor pillar opposed to the source/drain control gate has an inversion layer formed by a voltage applied to the source/drain control gate.

Preferably at least one of the upper direction and the lower direction of the semiconductor pillar has any one of a source electrode and a drain electrode and hot electrons caused by an application of a voltage to the electrode enter the source/drain control gate and are not injected to the floating gate.

The semiconductor pillar is preferably a p-type semiconductor pillar of $1\times10^{15}$ cm$^{-3}$ or more and $1\times10^{22}$ cm$^{-3}$ or less. However, it may be an n-type pillar.

A semiconductor integrated circuit may include any of a plurality of above described memory cells, wherein the plurality of the main control gates, the source/drain control gates, and the floating gates are provided along the respective semiconductor pillars. This structure allows NAND-type memory cell to be configured.

In the above structure, the respective semiconductor pillars are preferably provided on the substrate, a first select gate transistor is provided between the lowermost memory cell and the substrate, and a second select gate transistor is provided between the upper parts of the uppermost memory cell.

Preferably the respective semiconductor pillars are provided on the substrate and a pass transistor for connecting the semiconductor pillars adjacent to each other is formed on the substrate.

In order to achieve the fourth objective, a method of producing a semiconductor integrated circuit of the present invention, includes: a step of layering three types of different layers including a semiconductor material for a source/drain control gate on a substrate; a step of providing a line and a space to this layered layers and forming an opening up to the surface of the substrate; a step of etching a region functioning as a floating gate in the layers layered adjacent to the opening; a step of depositing, in the opening, a semiconductor material including the region functioning as the floating gate; a step of subjecting a region including the deposited semiconductor material to an anisotropic etching to form an opening in a region in which a semiconductor pillar and a tunnel insulating layer are to be formed and forming a floating gate; a step of depositing a tunnel insulating layer on a side wall of the opening formed by the anisotropic etching; a step of depositing a semiconductor material on the opening surrounded by the tunnel insulating layer to form a semiconductor pillar; a step of etching a region functioning as a main control gate of the side face of the floating gate; a step of depositing another insulating layer on a side wall of the region formed by etching; a step of depositing a material to be used for the main control gate on the another insulating layer; and a step of etching the material to be used for the main control gate so as to form a main control gate and a word line.

In the above structure, the semiconductor material is preferably any of poly silicon, silicon, metal, or silicide.

The material to be used for the main control gate and the source/drain control gate is preferably any of poly silicon, metal, or silicide.

The step of forming the three types of different layers on the substrate may be performed after a step of forming a source region or a drain region on a silicon substrate as the substrate.

The step of forming the three types of different layers on the substrate may be performed after a step of forming a pass transistor for connecting the semiconductor pillars provided adjacent to each other.

Advantageous Effects of Invention

The semiconductor integrated circuit of the present invention has a structure in which a control gate circumferentially covers the side face of a semiconductor pillar or covers a part thereof via an insulating layer on the outer circumference of the semiconductor pillar. This structure can allow the surface of the semiconductor pillar opposed to the control gate to have thereon an inversion layer. Thus, the control gate can be used as a source or a drain, thus consequently achieving the miniaturization of the memory cell.

Furthermore, no need is required to prepare a source or a drain by a diffusion step for example, thus achieving a reduced short channel effect. The electrostatic shielding effect by the control gate (so-called shield effect) can be used to eliminate the interference effect caused by the parasitic capacitance caused in neighboring memory cells in the conventional plane NAND-type flash memory cell. The memory cells by the semiconductor integrated circuit of the present invention can solve the drawback due to the high integration of the conventional plane NAND-type flash memory cell.

When the source/drain control gate circumferentially covers the side face of a semiconductor pillar or covers a part thereof via an insulating layer on the outer circumference of the semiconductor pillar, the surface of the semiconductor pillar opposed to the source/drain control gate can have thereon an inversion layer. The source/drain control gate can be used as a source or a drain, thus consequently achieving the miniaturization of the memory cell. The electrostatic shielding effect by the source/drain control gate (so-called shield effect) can be used to eliminate the interference effect caused by the parasitic capacitance caused in neighboring memory cells in the conventional plane NAND-type flash memory cell. In particular, the so-called shield effect can be used to completely suppress the interference issue as one of the most important issues for the current vertical NAND-type flash memory (i.e., the interference issue having a direct impact on a channel region of a selected cell from the floating gates of the neighboring cells). By adjusting the charge amount of the floating gate, the dependency of the threshold voltage of the selected cell can be also increased, thus achieving the multivalued storage for storing a plurality of pieces of bit information in one memory cell.

According to the method of producing the semiconductor integrated circuit of the present invention, the machining based on the minimum size requires only a very few steps including the opening for forming a semiconductor pillar for example, thus achieving an easy production of memory cells free from the deteriorated performance due to the miniaturization. Furthermore, such a reduced number of machining steps based on the minimum size also can reduce the cost per bit.

As described above, the present invention can solve the drawback due to the high integration of the conventional plane NAND-type flash memory cell.

BRIEF DESCRIPTION OF DRAWINGS

FIGS. 2(A), 2(B), and 2(C) respectively are a partial cross-sectional view, a plan view, and an equivalent circuit diagram of FIG. 2(A).

FIGS. 4(A) to 4(D) are views illustrating the operation of the vertical memory cell of the present invention. FIG. 4(A) shows the operation in the case of erasing. FIG. 4(B) shows the operation in the case of programming. FIG. 4(C) shows the operation in the case of write inhibition. FIG. 4(D) shows the operation in the case of reading.

FIG. 5(A) shows a memory cell of the present invention. FIG. 5(B) shows a serially-connected memory cell. FIG. 5(C) shows a flash memory cell of a comparison example.

FIG. 8(A) shows the ID-VCG characteristic. FIG. 8(B) shows the relation between the simulation reading current and the normalized reading current measured in the comparison example.

FIG. 9(A) shows the dependency of Vth on the charge. FIG. 9(B) shows the coupling capacitance.

FIG. 11(A) shows the relation between the initial Vth and the reading current. FIG. 11(B) shows the relation between the electron density induced over the surface of the p-type semiconductor pillar and the diameter of the p-type semiconductor pillar.

FIG. 12(A) shows the potential distribution. FIG. 12(B) shows the relation between the coupling rate and the potential distribution.

FIG. 25(A) shows the operation in the case of erasing. FIG. 25(B) shows the operation in the case of programming. FIG. 25(C) shows the operation in the case of write inhibition. FIG. 25(D) shows the operation in the case of reading.

FIG. 26(A) shows the conventional FG structure of the comparison example. FIG. 26(B) shows the ESCG structure as in the first embodiment. FIG. 26(C) shows the flash memory cell of the ESCG structure according to the eighth embodiment.

FIGS. 32(A) to 32(D) are schematic views illustrating the configuration of the memory cell string 95 according to the eleventh embodiment of the present invention and the production method thereof.

FIGS. 33(A) to 33(B) are views showing the basic structure of the conventional NAND-type flash memory. FIG. 33(A) shows a plane pattern. FIG. 33(B) is an equivalent circuit diagram.

REFERENCE SIGNS LIST

Figure 1:
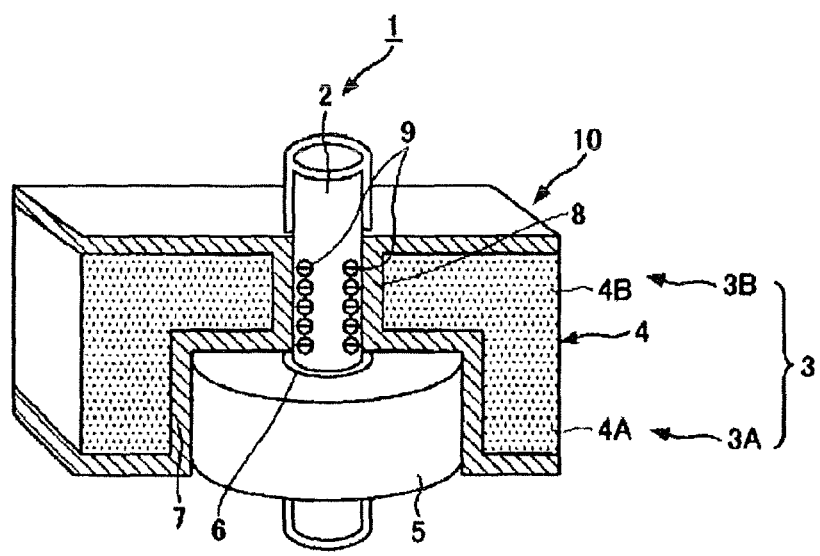
FIG. 1 is a perspective view illustrating the device structure of one memory cell provided in the semiconductor integrated circuit according to the first embodiment of the present invention.

1: Semiconductor integrated circuit
2: Semiconductor pillar
3: Gate
4, 24: Control gate
4A, 24A: First control gate
4B, 24B: Second control gate
5: Floating gate
6: Tunnel insulating layer
7, 8: Insulating layer
9: Inversion layer
10, 25, 31: Memory cell
10A, 20: Memory
11: First select gate transistor
12: Second select gate transistor
13: Substrate
14: Film layer (insulating layer)
13A, 14A: First film layer (first insulating layer)
13B, 14B: Second film layer (second insulating layer)
14C: Third film layer (third insulating layer)
15: Resist
16: poly Si(semiconductor material)
17: $SiO_2$ insulating film (insulating layer)
18: Oxidized film (insulating film)
19: Low-dielectric-constant layer
20A, 30, 35, 36, 37: Memory cell string
33: Pseudo control gate
38: Pass transistor
50: Semiconductor integrated circuit
52: Semiconductor pillar
53: Main control gate
54: Source/drain control gate
55: Floating gate
56: Tunnel insulating film (tunnel insulating layer)
57, 58: Insulating layer
59: Electric inversion layer
60: Memory cell
61, 61A: First select gate transistor
62: Second select gate transistor
63: Substrate
64: Insulating layer (layer film)
64A: First insulating layer
64B: Second insulating layer
65: Resist
66: Poly Si (semiconductor material)
67: Oxidized film (insulating film)
70, 80, 81, 82, 90, 91, 92: Memory cell string
83: Pass transistor
93: Source line inversion layer
96, 97: Single-crystal Si layer

DESCRIPTION OF EMBODIMENTS

The following section will describe some embodiments of the present invention with reference to the drawings.

First Embodiment

FIG. 1 is a perspective view illustrating the device structure of one memory cell 10 provided in the semiconductor integrated circuit 1 according to the first embodiment of the present invention.

As shown in FIG. 1, the memory cell 10 provided in the semiconductor integrated circuit 1 has: a semiconductor pillar 2 that serves as a channel; a floating gate 5 that circumferentially covers the side face of the semiconductor pillar 2 via an insulating layer 6 on the outer circumference of the semiconductor pillar 2; and a control gate 4 that circumferentially covers the side face of the semiconductor pillar 2 via an insulating layer 8 on the outer circumference of the semiconductor pillar 2 and that circumferentially covers the side face of the floating gate 5 via an insulating layer 7 on the outer circumference of the floating gate 5. Among the insulating layers, the insulating layer 6 provided between the semiconductor pillar 2 and the floating gate 5 is a tunnel insulating layer. In addition to the insulating layer 6, the insulating layer 7 is provided between the floating gate 5 and the control gate 4 and the insulating layer 8 is provided between the semiconductor pillar 2 and the control gate 4. The memory cell 10 is a so-called vertical memory cell.

The respective insulating layers of the tunnel insulating layer 6 and the insulating layers 7 and 8 are collectively called an insulating layer.

This semiconductor pillar 2 can be formed on a substrate composed of semiconductor such as Si or an SOI substrate (not shown). The semiconductor pillar 2 can be formed by silicon (Si) for example and is also called a silicon pillar 2. The semiconductor pillar 2 that serves as a channel may include a p-type or n-type semiconductor pillar. In the following section, the semiconductor pillar 2 that serves as a channel will be described as a p-type semiconductor. The semiconductor pillar 2 may have an impurity density of $1 \times 10^{15}$ cm$^{-3}$ or more and $1 \times 10^{22}$ cm$^{-3}$ or less.

The tunnel insulating layer 6 has a thickness of about 2 nm to 20 nm. The insulating layer 7 provided between the outer circumference section of the floating gate 5 and the control gate 4 and the insulating layer 8 provided between the semiconductor pillar 2 and the control gate 4 have a thickness of about 5 nm to 100 nm.

The control gate 4 is composed of the first control gate 4A and the second control gate 4B. The first control gate 4A is provided at the outer circumference of the floating gate 5 via the insulating layer 7. The second control gate 4B is provided at the outer circumference of the semiconductor pillar 2 via the insulating layer 8. The first control gate 4A and the second control gate 4B are both formed along the axial direction of the semiconductor pillar 2.

A gate 3 is divided to a region 3A and a region 3B. The region 3A has: the floating gate 5 circumferentially formed via the tunnel insulating layer 6 so as to surround the side face of the semiconductor pillar 2; and the first control gate 4A provided via the insulating layer 7 of the outer circumference section of the floating gate 5. The region 3B has: the second control gate 4B that is provided via the insulating layer 8 so as to surround the side face of the p-type semiconductor pillar 2 or the side face of the upper side of the floating gate 5. The region 3A has the same structure as in the conventional flash memory cell.

The first embodiment of the present invention is characterized in that the second control gate 4B is provided at the region 3B of the gate 3 of the memory cell. The following section will describe this structure in detail.

The second control gate 4B has an inner circumference section that is opposed to the surface of the p-type semiconductor pillar 2 via the insulating layer 8. Thus, when a voltage is applied to the control gate 4, the surface of the p-type semiconductor pillar 2 have thereon induced electrons having an opposite conductivity type to those of the holes as many carriers on the p-type semiconductor pillar 2, thus forming a so-called inversion layer 9.

As a result, the surface of the p-type semiconductor pillar 2 has thereon a region including many electrons, resulting in a status equivalent to a status in which a very shallow n-type diffusion region is formed. This inversion layer 9 functions as both of a source region of the memory cell 10 and a drain region of the memory cell provided at the upper side. The second control gate 4B functions to shield a neighboring memory cell. This can consequently eliminate the parasitic capacitance of a neighboring memory cell.

The second control gate 4B of the present invention will be called an Extended Sidewall Control Gate (ESCG).

By allowing the semiconductor integrated circuit 1 to have the cell structure as shown in FIG. 1, advantages can be obtained in which the storage of multi-bit information in the cell is simplified and the cell array control or a further-reduced area required for 1 bit can be achieved for example.

Figure 2A:
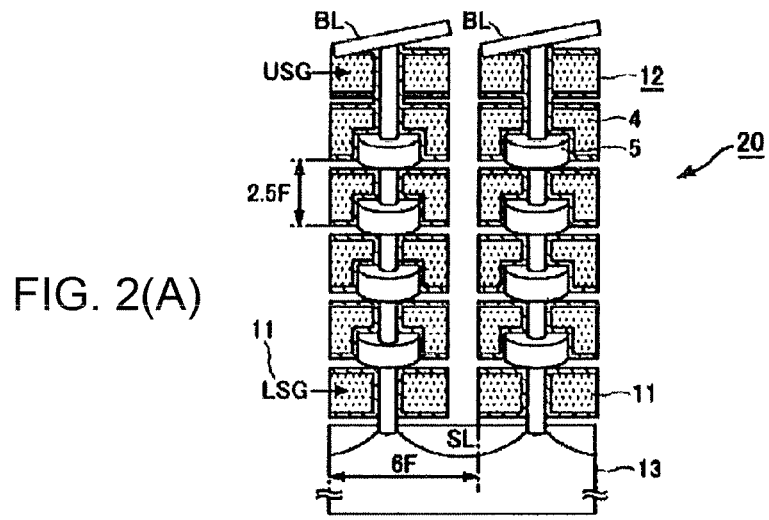
FIGS. 2(A) to 2(C) illustrate the device structure of a 4 bit memory using a vertical memory cell according to the first embodiment of the present invention.
Figure 2B:
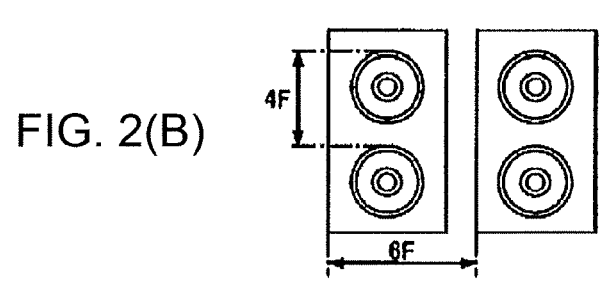
Figure 2C:
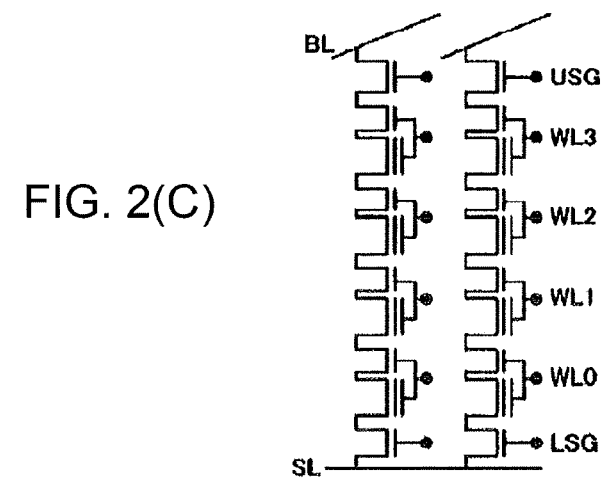

FIGS. 2(A) to 2(C) illustrate a device structure of a 4-bit memory using the vertical memory cell according to the first embodiment of the present invention. FIGS. 2(A), 2(B), and 2(C) respectively are a partial cross-sectional view, a plan view, and an equivalent circuit diagram.

As shown in FIG. 2(A), a memory 20 is composed of four memory cells shown in FIG. 1 serially connected in the axial direction of the p-type semiconductor pillar 2.

The memory cell at the bottom side and a substrate 13 have therebetween a first select gate transistor (Lower select gate) 11. The source of the first select gate transistor 11 is provided in the n-type diffusion region of the substrate 13 to form a source line SL. The memory cell at the top side has thereon a second select gate transistor (Upper select gate) 12. The drain of the second select gate transistor 12 forms a bit line BL.

The first select gate transistor 11 and the second select gate transistor 12 are a vertical n channel MOS transistor. The first select gate transistor 11, the four memory cells, and the second select gate transistor 12 are serially-connected, thereby constituting a memory cell string.

As shown in FIG. 2(B), when the minimum machining size is assumed as F, the minimum machining area of the 4 bit memory cell string having a lateral size of 6F and a longitudinal size of 4F can be calculated as 24F$^2$. The minimum machining size is about 2× nm as the minimum machining size of the next generation. Although X is not determined, F is about 22 nm when X is about 70 percent of the current 32 nm process.

In order to form the second control gate 4B functioning as an ESCG, one memory cell has a height of about 2.5F. The minimum machining area required to form a NAND structure string is larger than the charge trap-type vertical memory cell. However, the bit cost of the memory of the present invention is significantly lower than that of the conventional plane NAND structure flash memory cell when the bit number is 8 bit or more.

TABLE 1

| | Conventional | | Example of the effect of the present invention |
|---|---|---|---|
| | Vertical SONOS | Plane floating gate | Vertical floating gate (E-S/D) |
| NAND string area | 4F*2F | 2F*2F*NC | 6F*2F |
| Cell size | $0.5F^2$ | $4.24F^2$ | $1.5F^2$ |
| Cell height | 2F | Up to 200 nm | 2.5F |
| Writing speed | Very high | Low | High |
| Reliability | Low | High | High |
| Barrier height | 1.0 eV | 3.15 eV | 3.15 eV |
| Interference | No | Worst | No |

*NC shows the number of cells.

The production method of the memory cell according to the first embodiment of the present invention can be carried out through the following steps. FIG. 3A to FIG. 3G are view illustrating the main steps of the production method of the memory cell.

First step: The first step is a step of layering three types of different film layers 14 on the substrate 13 subjected to a predetermined processing for example.

The three types of different film layers 14 are composed of, in an order from the bottom side, a first film layer 14A, a second film layer 14B, and a third film layer 14C. The first film layer 14A is a $SiO_2$ layer for example. The second film layer 14B is a high-density $SiO_2$ layer for example. The third film layer 14C is a $Si_3N_4$ layer for example. The materials of the first to third film layers 14A to 14C are not limited to the above examples. Specifically, the first to third film layers 14A to 14C may be composed of any materials so long as the materials can be selectively etched to one another in an isotropic etching.

Second step: The second step is a step of providing lines and spaces in the layered layers by resist 15 for example. An opening is provided up to the surface of the substrate 13. Then, an anisotropic etching is performed on a region in which the semiconductor pillar 2 and the tunnel insulating layer 6 are formed among the layered layers adjacent to this opening (see FIG. 3A). The anisotropic etching can be performed by a reactive ion etching (RIE).

Third step: The third step is a step of subjecting, from among the film layers layered adjacent to the opening, the third film layer 14C in a region functioning as the floating gate 5 to an isotropic etching (see FIG. 3B).

The isotropic etching can be performed by a chemical etching using chemical solution.

Fourth step: The fourth step is a step of depositing, on the opening, the semiconductor material 16 functioning as the floating gate 5 including a region functioning as the floating gate 5 (see FIG. 3C). The semiconductor material 16 may be made of silicon material such as poly Si.

Fifth step: The fifth step is a step of subjecting, to an anisotropic etching, the region in which the semiconductor material 16 is deposited so that an opening is formed in a region in which the semiconductor pillar 2 and the tunnel insulating layer 6 are to be formed and so that the floating gate 5 is formed.

Sixth step: The sixth step is a step of forming the tunnel insulating layer 6 at the side wall of the opening formed by the anisotropic etching (see FIG. 3D).

Seventh step: The seventh step is a step of depositing the semiconductor material 16 in the opening surrounded by the tunnel insulating layer 6 to form the semiconductor pillar 2 (see FIG. 3E).

Eighth step: The eighth step is a step of performing an isotropic etching on the three types of different layer except for a layer including the floating gate 5 composed of poly Si and the second film layer 14B functioning as an intercell separation layer (see FIG. 3F).

Ninth step: The ninth step is a step of forming another $SiO_2$ insulating layer 17 on the floating gate 5, the layer functioning as a separation layer, and the tunnel insulating layer 6 (see FIG. 3G).

Tenth step: The tenth step is a step of depositing, on the another $SiO_2$ insulating layer 17, the material 16 to be used for the control gate 4 and a step of etching this material 16 to form the control gate 4 and the first select gate 11 and the second select gate 12 (see FIG. 3H).

The material to be used for the control gate 4 may be, instead of poly Si, metal or silicide.

In FIG. 3A to FIG. 3H, when the first select gate transistor 11 and the second select gate transistor 12 are formed together, attention must be paid on the following point.

The first select gate transistor 11 and the second select gate transistor 12 are select gate transistors that are provided at the top and bottom sides of the NAND string as shown in FIG. 2(A) and are select gates that select a specific semiconductor pillar 2. Thus, the first select gate transistor 11 and the second select gate transistor 12 do not need to include the control gate 4 and the floating gate 5 of the present invention.

Figure 3A:
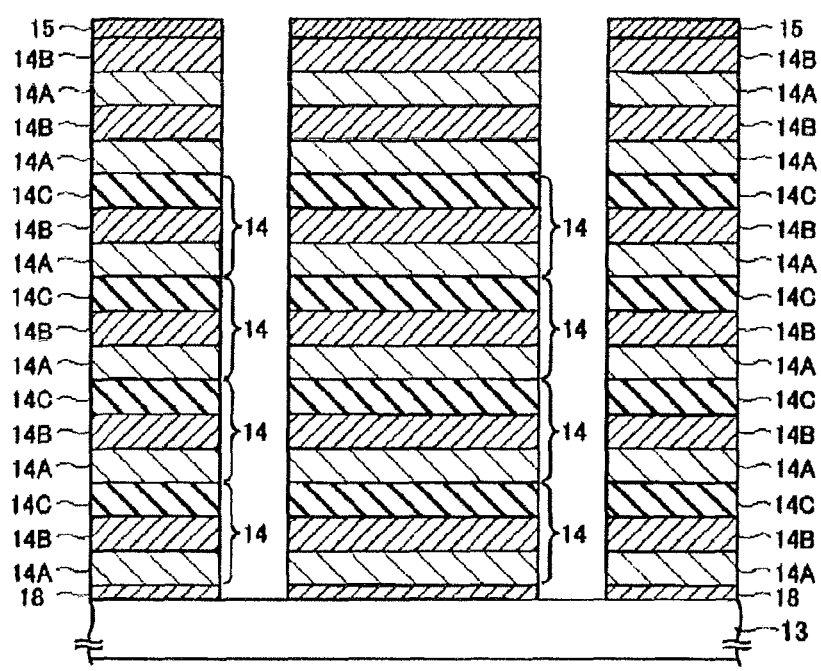
FIG. 3A is a view illustrating the second step of the production step of a memory cell.
Figure 3B:
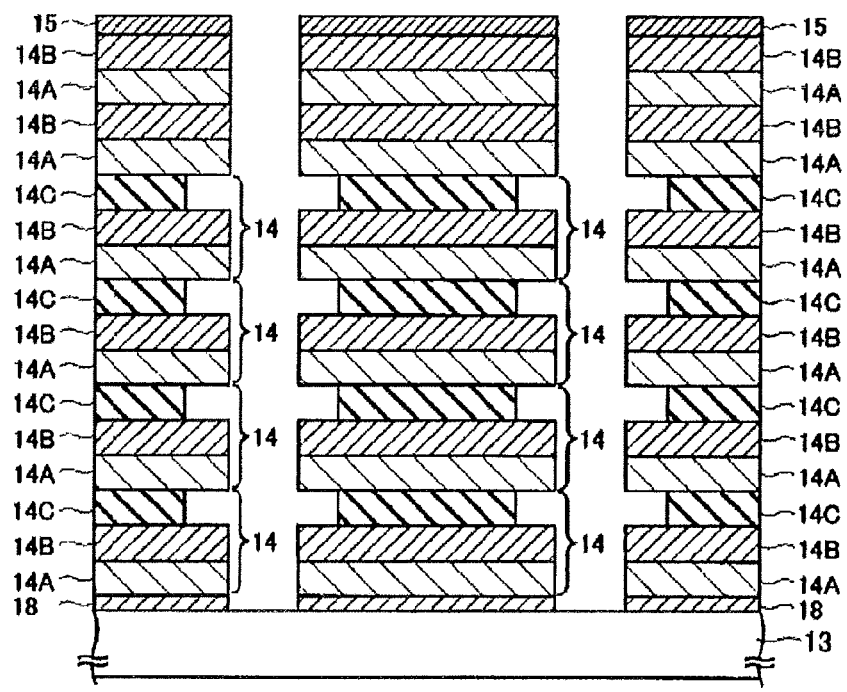
FIG. 3B is a view illustrating the third step of the production step of the memory cell.
Figure 3C:
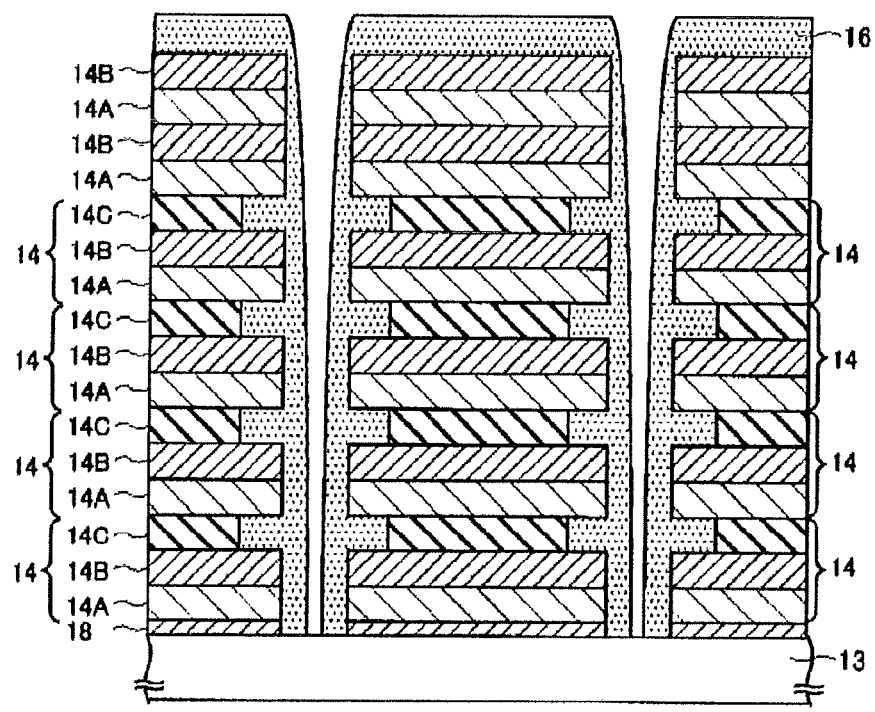
FIG. 3C is a view illustrating the fourth step of the production step of the memory cell.
Figure 3D:
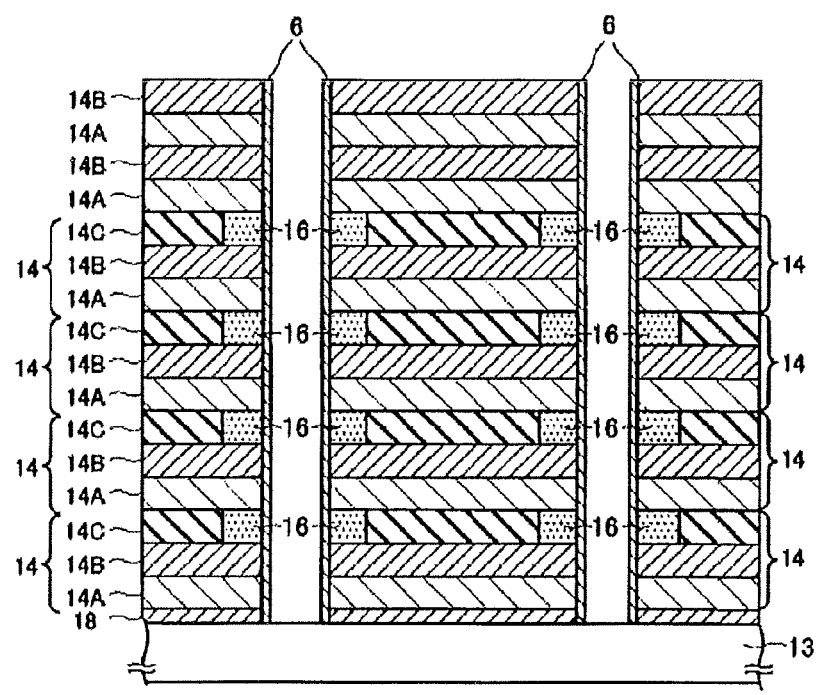
FIG. 3D is a view illustrating the sixth step of the production step of the memory cell.
Figure 3E:
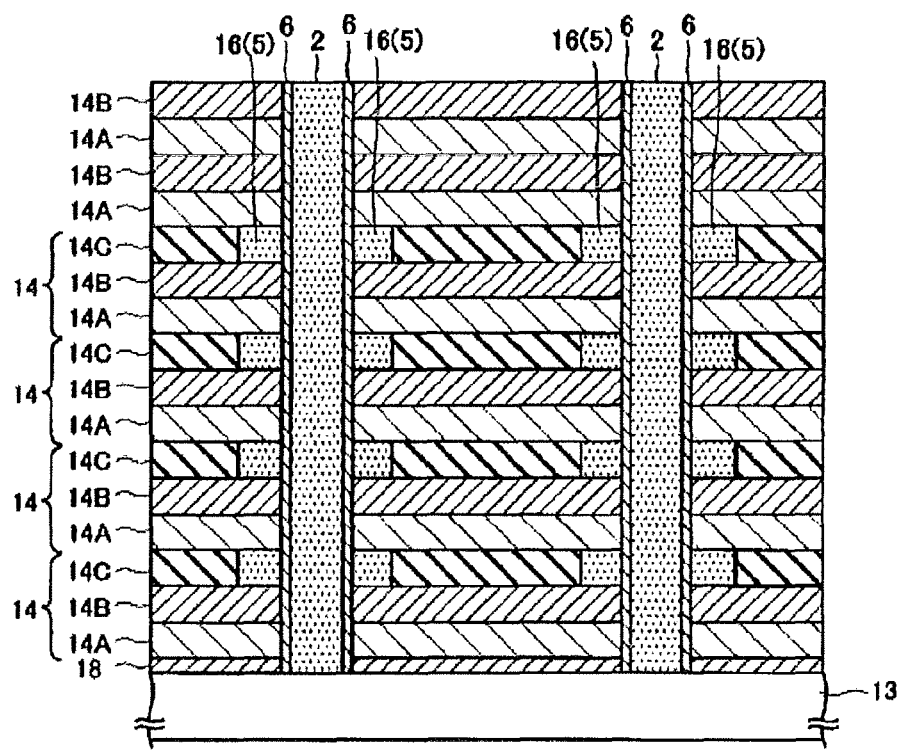
FIG. 3E is a view illustrating the seventh step of the production step of the memory cell.
Figure 3F:
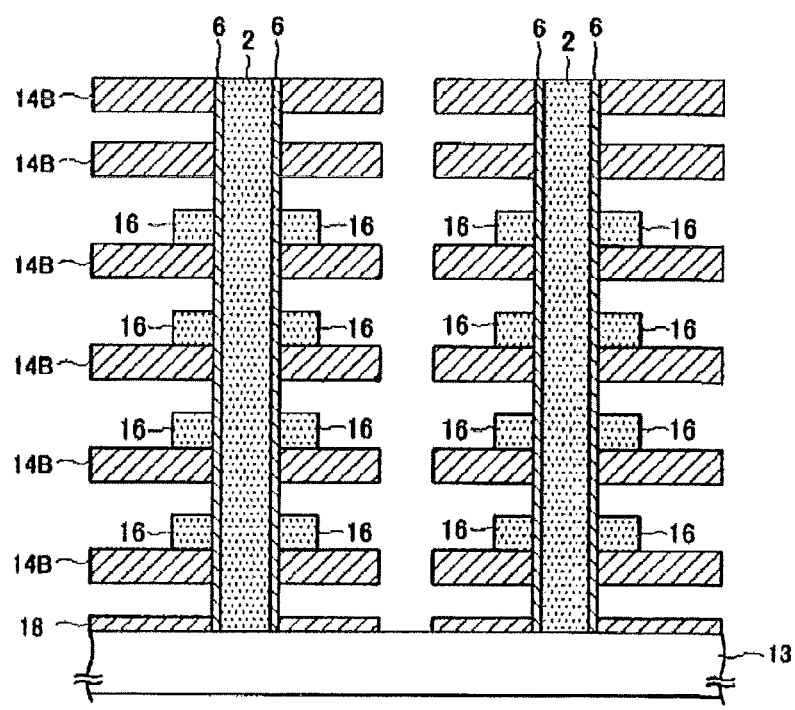
FIG. 3F is a view illustrating the eighth step of the production step of the memory cell.
Figure 3G:
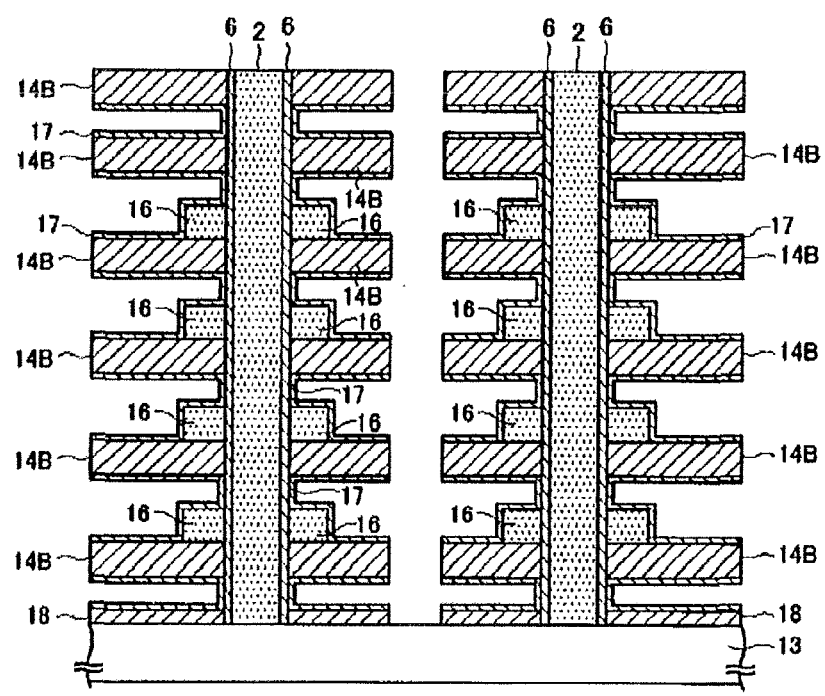
FIG. 3G is a view illustrating the ninth step of the production step of the memory cell.
Figure 3H:
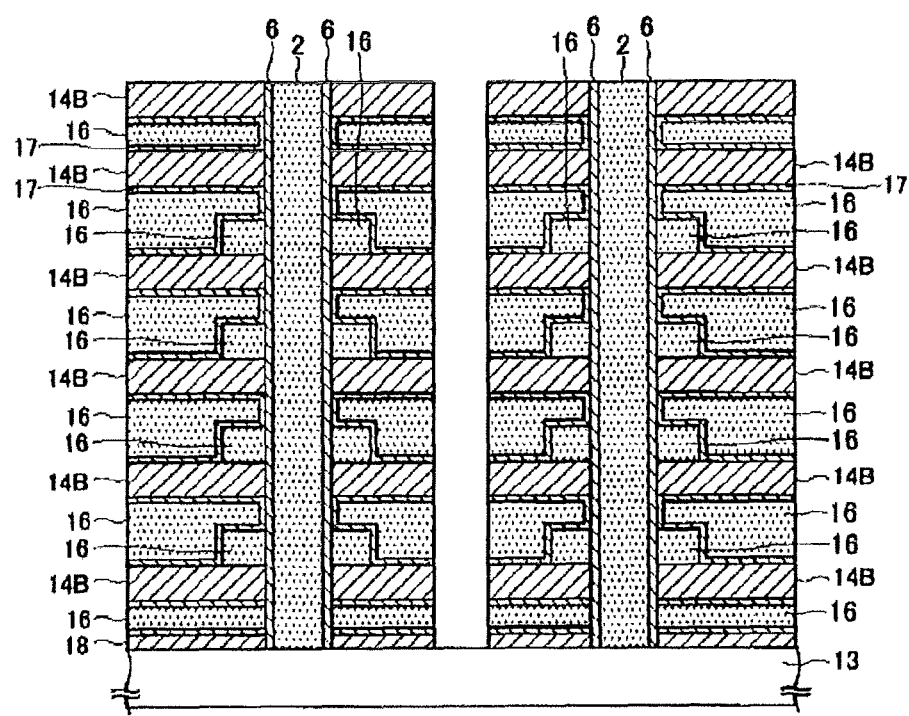
FIG. 3H is a view illustrating the tenth step of the production step of the memory cell.

For example, with regard to the first select gate transistor 11, prior to the formation of the three types of different film layers 14, an insulating layer 18 may be formed on the substrate 13. Then, as shown in FIG. 3G and FIG. 3H, when the poly Si layer 16 is formed on the gate insulating layer 6 to form the control gate 4, the first select gate transistor 11 can be formed simultaneously with the memory cell. Similarly, the second select gate transistor 12 can be formed on the top part of the memory cell simultaneously with the memory cell as in the first select gate transistor 11. In this case, a word line may be formed simultaneously with the control gate 4 (see the poly Si 16 at the top of FIG. 3H).

FIGS. 4(A) to 4(D) are views illustrating the operation of the vertical memory cell of the present invention. FIG. 4(A) shows the operation in the case of erasing. FIG. 4(B) shows the operation in the case of programming. FIG. 4(C) shows the operation in the case of write inhibition. FIG. 4(D) shows the operation in the case of reading.

As shown in FIG. 4(A), the erasing of the memory cell of the present invention is performed on a block basis. The erasing operation is performed by applying a voltage to the p-type semiconductor pillar to extract electrons from the floating gate 5.

As shown in FIG. 4(B), information is written to the memory cell of the present invention by injecting electrons into the floating gate 5 by the quantum tunnel effect. The n-type semiconductor region of the substrate 13 (i.e., the source line SL) is allowed to have a ground potential and the writing voltage ($V_{program}$) is applied to the control gate 4 by small current. The information is stored in the electrons accumulated in the floating gate 5. The writing operation is performed on the basis of a page unit. The writing voltage is simultaneously applied to the control gate 4 for all cells within the same page to thereby perform a writing operation.

As shown in FIG. 4(C), the operation to forbid the writing to the memory cell of the present invention is an operation to prevent cells not to be written from being written during the writing operation.

As shown in FIG. 4(D), in the memory cell of the present invention, information is read on the basis of a page unit.

When the floating gate 5 includes a fixed amount of electrons, only slight current flows between the source and the drain and this status is assumed as "0". When the floating gate 5 does not include a fixed amount of electrons, relatively high current is allowed to flow between the source and the drain and this status is assumed as "1".

As described above, the vertical memory cell having the ESCG structure of the present invention can perform the memory operation similar to that by a general plane NAND flash memory cell. In particular, a bulk deletion method can be used by using the ESCG structure. Specifically, the electric n-type region formed by the ESCG structure has a very thin thickness. Thus, the p-type semiconductor pillar 2 contacts with the semiconductor substrate 13 (bulk) such as Si. Thus, the memory cell of the semiconductor integrated circuit 1 of the present invention can use the bulk deletion method as in the general plane NAND flash memory cell.

The following section will describe various characteristics of the memory cell of the present invention with regards to a calculation example.

Various characteristics of the memory cell of the present invention were calculated using the calculation software (TCAD) for the semiconductor integrated circuit developed by the present inventors.

Figure 5A:
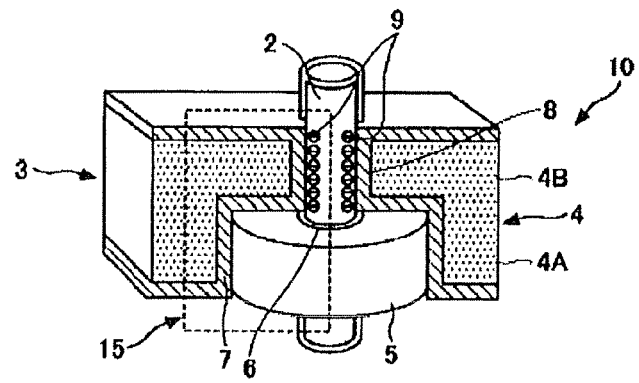
FIGS. 5(A) to 5(C) are views illustrating a calculation model used for simulation.
Figure 5B:
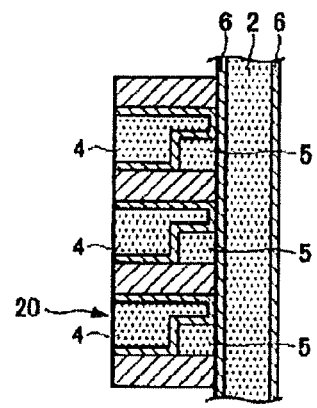
Figure 5C:
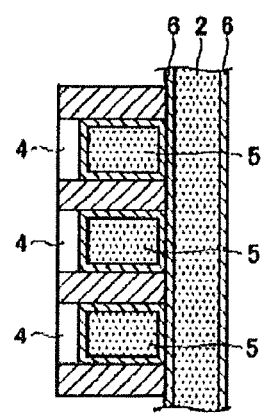

FIGS. 5(A) to 5(C) are views of illustrating the calculation model used for the simulation. FIG. 5(A) shows a memory cell of the present invention. FIG. 5(B) shows a serially-connected memory cell. FIG. 5(C) shows a flash memory cell of a comparison example.

As shown in FIG. 5(B), the calculation model of the memory cell of the present invention is the left region surrounded by the dotted line in the memory cell 10 shown in FIG. 5(A). The flash memory cell of the comparison example is a memory cell not having an ESCG structure.

By the above model, various coefficients of the flash memory cell of the general plane NAND structure were examined based on the current minimum machining size of 30 nm. In order to perform the calculation close to the actual operation, such parameters were selected that were Fowler-Nordheim tunnel current coefficients A and B expressed by the following formula (1) based on the coupling capacitance to the control gate 4 and the external resistance by a not-selected memory cell.

$$I = A * Etox^2 * \exp(-B/Etox) \quad (1)$$

In the formula, Etox shows the electric field strength applied to the tunnel insulating layer 6.

Figure 6:
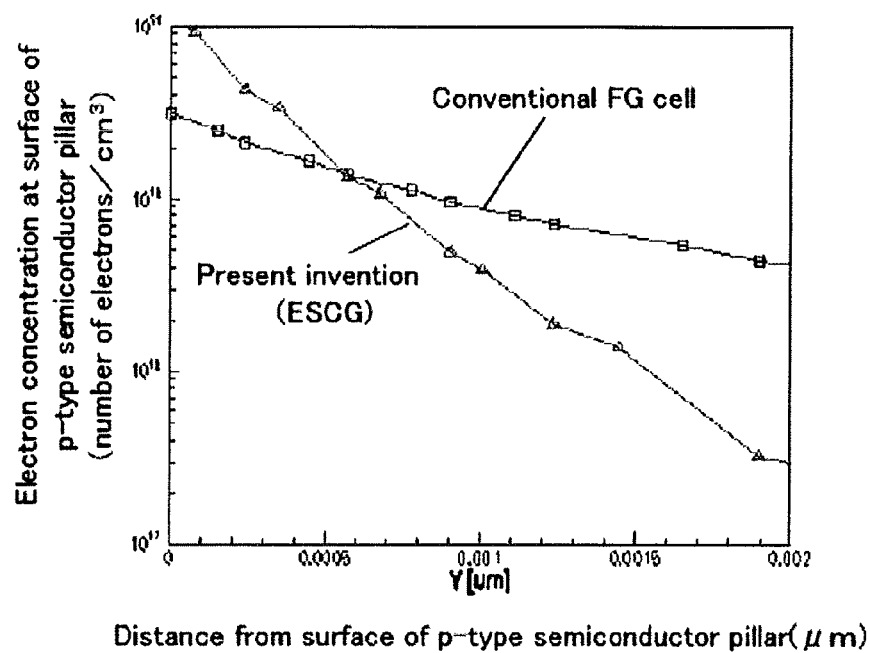
FIG. 6 is a view showing the result of the simulation of the electron concentration at the surface of the p-type semiconductor pillar with regard to the memory cell of the present invention and the conventional flash memory cell of the comparison example.

FIG. 6 is a view of showing the result of the simulation of the electron concentration at the surface of the p-type semiconductor pillar 2 with regard to the memory cell of the present invention and the conventional flash memory cell of the comparison example. In FIG. 6, the horizontal axis shows the distance (μm) from the surface of the p-type semiconductor pillar 2 and the vertical axis shows the electron concentration (the number of electrons/cm$^3$) at the surface of the p-type semiconductor pillar 2.

As can be seen from FIG. 6, when the above parameters are optimized, the surface of the p-type semiconductor pillar 2 of the memory cell of the present invention shows the electron concentration higher than the measurement value in the case of the comparison example because the control gate 4 has an ESCG structure.

Figure 7:
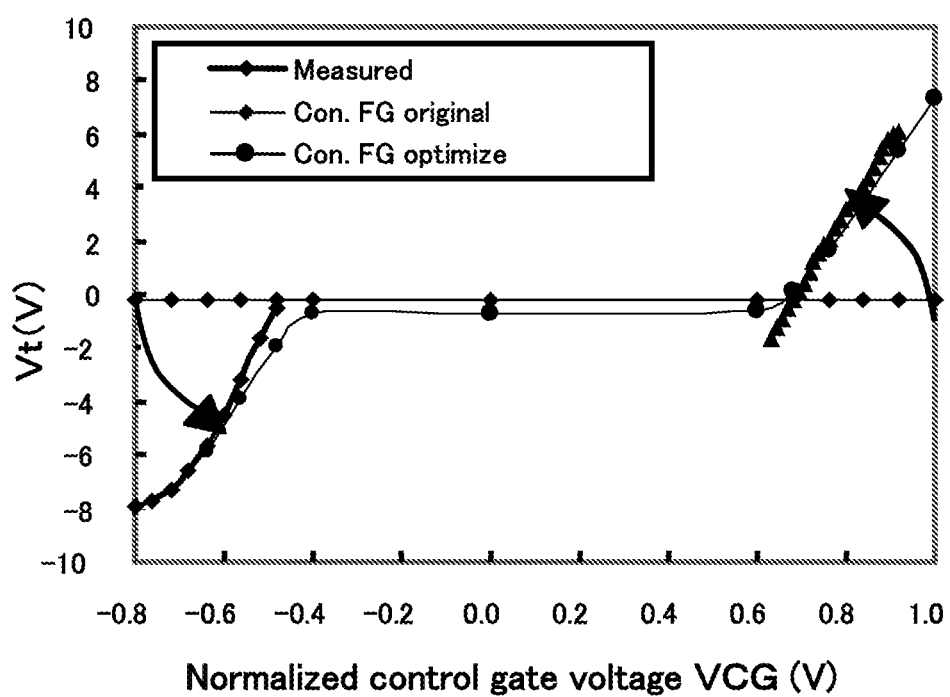
FIG. 7 is a view showing the result of the simulation of Vt to a normalized control gate voltage VCG.

FIG. 7 is a view showing the result of the simulation of Vt to the normalized control gate voltage VCG. In FIG. 7, the horizontal axis shows the normalized control gate voltage VCG(V) and the vertical axis shows Vt(V). FIG. 7 shows both of the result of the optimization to the first floating gate 5 and the measurement value of the comparison example. As shown in FIG. 7, by the optimization of the parameters, the memory cell of the present invention shows a high consistency with the measurement values of the comparison example.

Figure 8A:
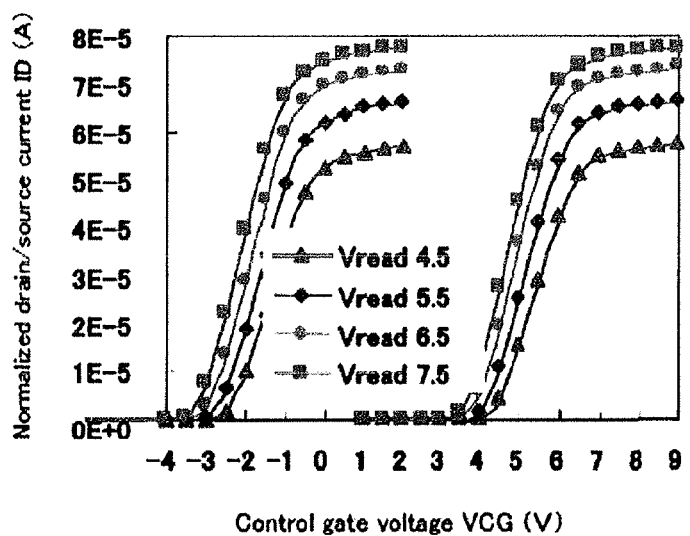
FIGS. 8(A) to 8(B) are views showing the result of the simulation of the memory cell of the present invention.
Figure 8B:
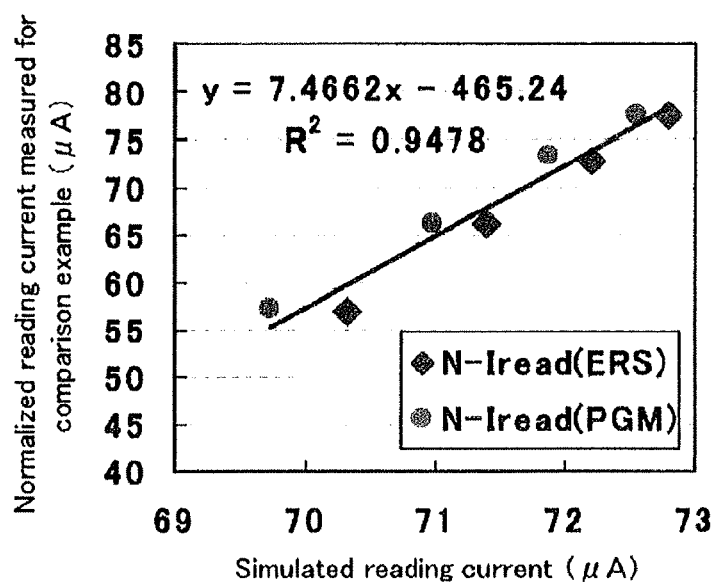

FIGS. 8(A) to 8(B) are views showing the result of the simulation of the memory cell of the present invention. FIG. 8(A) shows an ID-VCG characteristic. FIG. 8(B) shows the relation between the simulated reading current and the normalized reading current measured for the comparison example. In FIG. 8(A), the horizontal axis shows the control gate voltage VCG (V) and the vertical axis shows the normalized drain/source current ID (A). In FIG. 8(A), the left graph shows the measurement value of the conventional flash memory cell of the comparison example. In FIG. 8(A), the right graph shows the result of the simulation of the memory cell of the present invention.

As can be seen from FIG. 8(A), by the optimization of the parameters, the memory cell of the present invention shows an ID-VG characteristic having a high consistency with the measurement value of the comparison example.

In FIG. 8(B), the horizontal axis shows the simulated reading current (μA) and the vertical axis shows the normalized reading current (μA) measured for the comparison example. As can be seen in FIG. 8(B), by the optimization of the parameters, the memory cell of the present invention shows the simulated reading current having a high consistency with the measurement value of the comparison example.

Figure 9A:
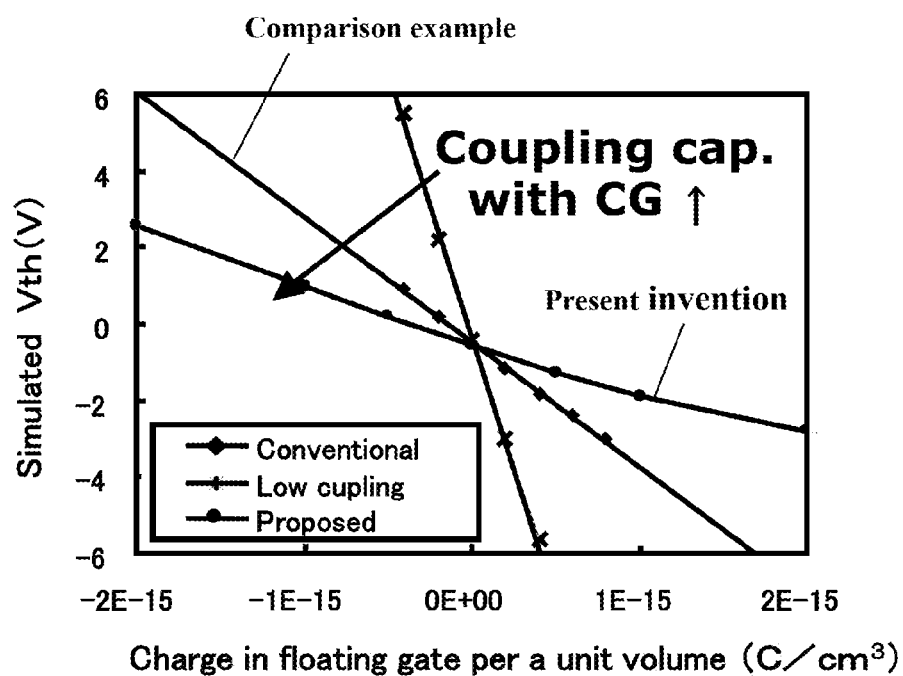
FIGS. 9(A) to 9(B) are views showing the result of the simulation of the charge injected to the floating gate of the memory cell of the present invention.
Figure 9B:
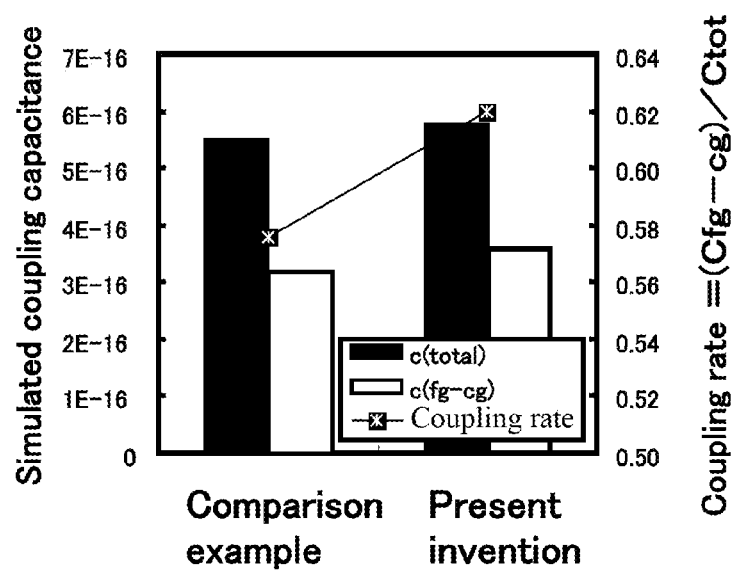

FIGS. 9(A) to 9(B) are views showing the result of the simulation of the charge injected to the floating gate 5 of the memory cell of the present invention. FIG. 9(A) shows the dependency of Vth on the charge. FIG. 9(B) shows the coupling capacitance. In FIG. 9(A), the horizontal axis shows the charge (C/cm$^3$) in the floating gate per a unit volume and the vertical axis shows the simulated Vth(V). As can be seen from FIG. 9(A), the memory cell having the ESCG structure of the present invention has Vth smaller than that of the flash memory cell of the comparison example. It was found that the capacity ratio (Cfg/Ccg) of the memory cell was increased due to the action by the control gate 4(CG) and that the parasitic capacitance formed by neighboring memory cells was shielded by the control gate 4.

In FIG. 9(B), the left vertical axis shows the simulated coupling capacitance and the right vertical axis shows the coupling rate represented by the following formula (2).

$$\text{Coupling rate} = C(fg-cg)/Ctot \quad (2)$$

In the formula, C(fg-cg) shows the capacitance between the floating gate and the control gate and Ctot shows the entire capacitance seen from the floating gate. As can be seen from FIG. 9(B), the memory cell having the ESCG structure of the present invention shows an increased capacitance coupling rate between the floating gate and the control gate, thus improving the cell performance.

Figure 10:
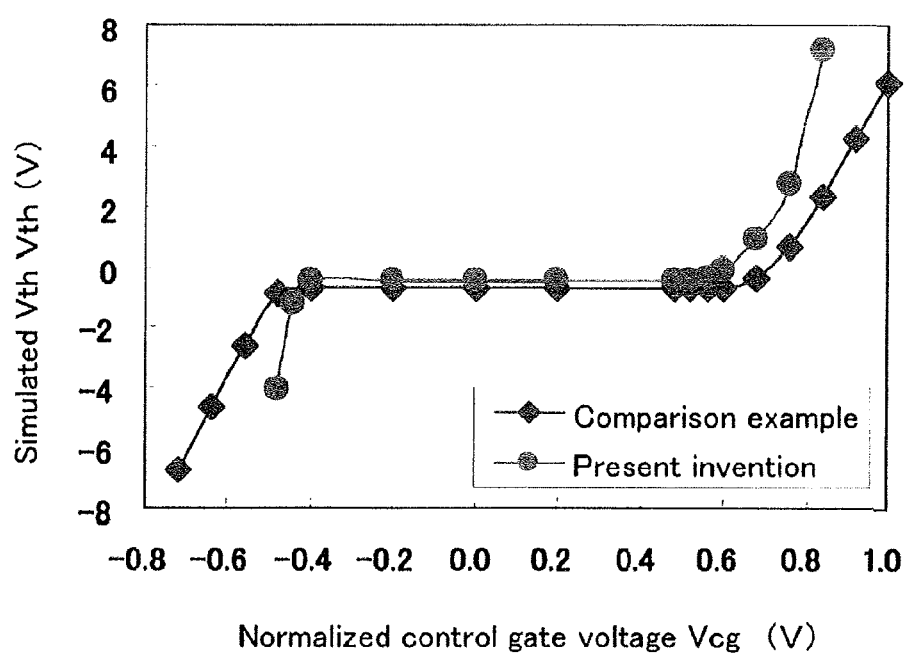
FIG. 10 is a view of showing the result of the simulation regarding the dependency of the writing voltage and the erase voltage on the normalized control gate voltage.

FIG. 10 is a view showing the result of the simulation of the dependency of the writing voltage and the erase voltage on the normalized control gate voltage. In FIG. 10, the horizontal axis shows the normalized control gate voltage Vcg (V) and the vertical axis shows the simulated Vth(V). In FIG. 10, the circle plots (●) show the result of the memory cell of the present invention while the trapezoid plots (◆) show the result of the comparison example.

As can be seen from FIG. 10, the memory cell of the present invention shows a higher coupling rate represented by the formula (2) than that of the comparison example.

Thus, depending on Vcg (V) during writing, the floating potential of the floating gate 5 changes and Vth also changes. Thus, the control gate of the present invention can remarkably reduce the writing time and the erasing time.

Figure 11A:
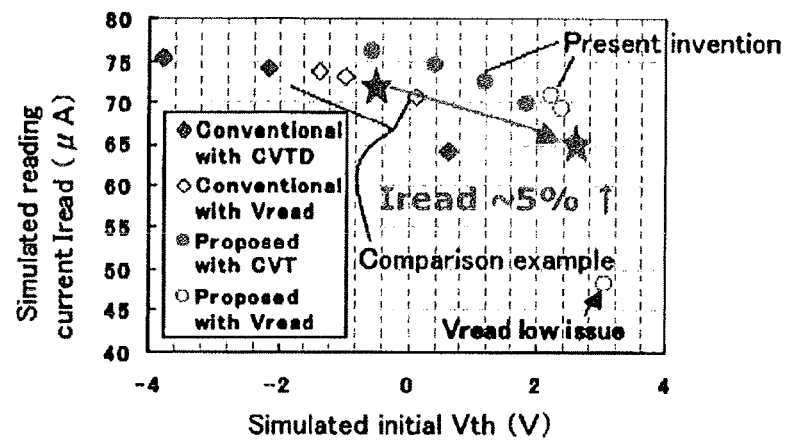
FIGS. 11(A) to 11(B) are views showing the result of the simulation of the reading current of the memory cell of the present invention and the electron density induced over the surface of the p-type semiconductor pillar.
Figure 11B:
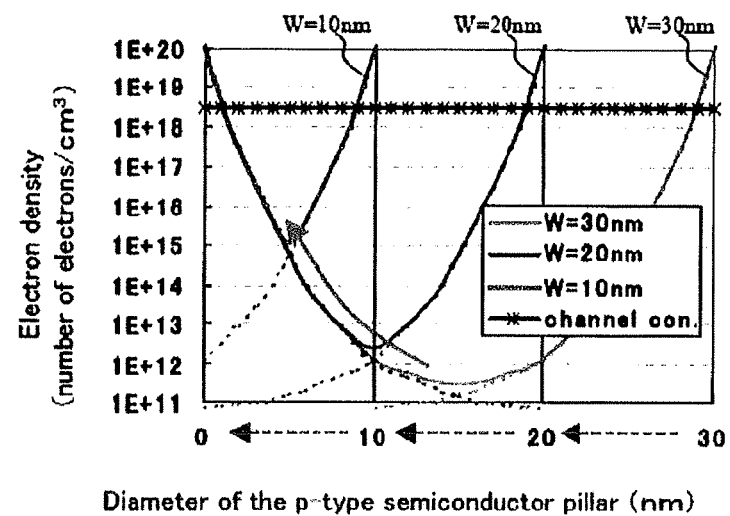

FIGS. 11(A) to 11(B) are views showing the result of the simulation of the reading current of the memory cell of the present invention and the electron density induced over the surface of the p-type semiconductor pillar 2. FIG. 11(A) shows the relation between the initial Vth and the reading current. FIG. 11(B) shows the relation between the electron density induced over the surface of the p-type semiconductor pillar 2 and the diameter (nm) of the p-type semiconductor pillar 2. In FIG. 11(A), the horizontal axis shows the simulated initial Vth (V) while the vertical axis shows the simulated reading current Iread (μA).

As can be seen from FIG. 11(A), the memory cell having the ESCG structure of the present invention shows a 5%-higher reading current Iread than in the case of the comparison example. The reason is that, even when the p-type semiconductor pillar 2 has a lowered impurity density, the ESCG structure provides a high electron density to the inversion layer 9 formed at the surface of the p-type semiconductor pillar 2 opposed to the control gate 4.

In FIG. 11(B), the horizontal axis shows the diameter (nm) of the p-type semiconductor pillar 2 while the vertical axis shows the electron density (the number of electrons/$cm^3$) induced over the surface of the p-type semiconductor pillar 2. As can be seen from FIG. 11(B), the memory cell having the ESCG structure of the present invention shows such an electron density induced over the surface that increases with the decrease of the diameter W(nm) of the p-type semiconductor pillar 2 from 30 nm through 20 nm to 10 nm.

Figure 12A:
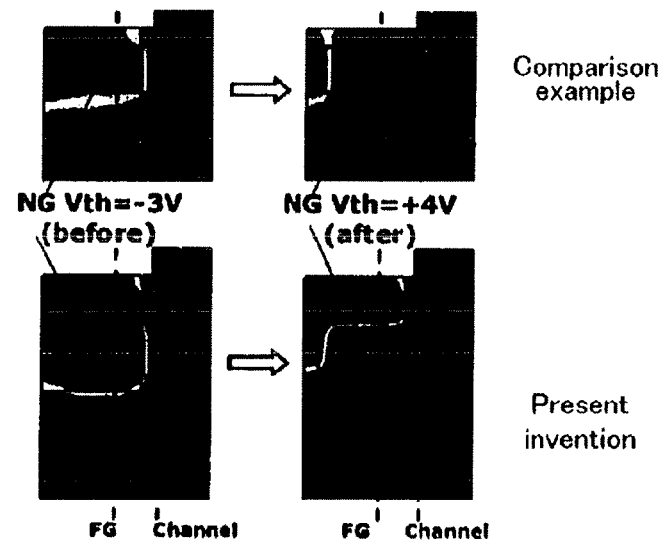
FIGS. 12(A) to 12(B) are views showing the result of the simulation of the interference between the neighboring memory cells with regard to the memory cell of the present invention and the flash memory cell of the comparison example.
Figure 12B:
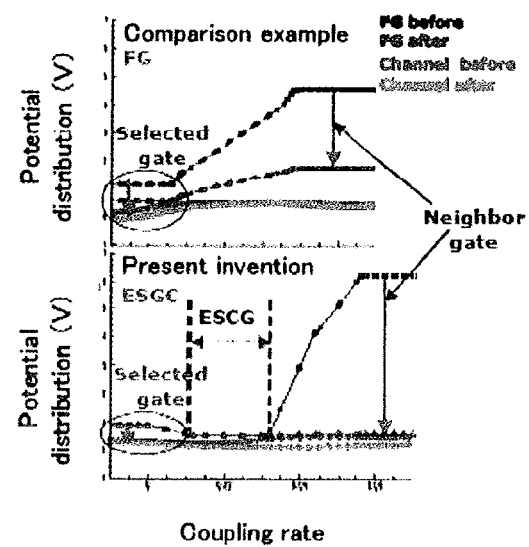

FIGS. 12(A) to 12(B) are views showing the result of the simulation of the interference between the neighboring memory cells for the memory cells of the present invention and the comparison example. FIG. 12(A) shows the potential distribution. FIG. 12(B) shows the relation between the coupling rate and the potential distribution. As can be seen from FIG. 12(A), the memory cell having the ESCG structure of the present invention shows, when Vth changes from −3V to +4V, the potential variation smaller than in the case of the comparison example, thus achieving the suppression of the interference between the neighboring memory cells.

In FIG. 12(B), the horizontal axis shows the coupling rate while the vertical axis shows the potential distribution (V). In FIGS. 12(A) to 12(B), the upper section shows the comparison example while the lower section shows the present invention. As can be seen from FIG. 12(B), the memory cell having the ESCG structure of the present invention shows, even when the coupling rate is high, a smaller potential variation than in the case of the comparison example, thus achieving the suppression of the interference between the neighboring memory cells.

Figure 13:
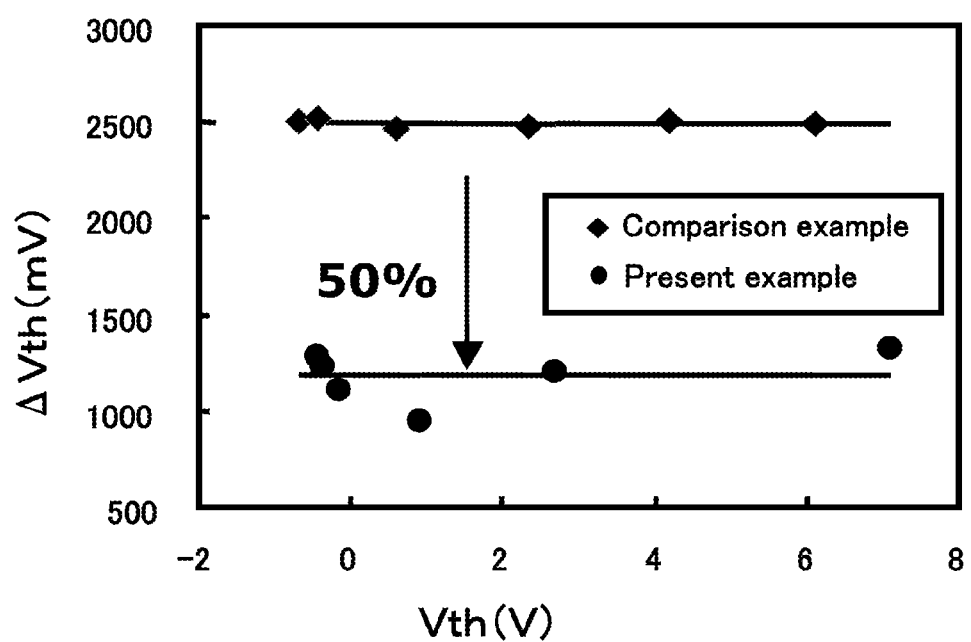
FIG. 13 is a view showing the result of the simulation of the interference between the neighboring memory cells for the memory cell of the present invention and the flash memory cell of the comparison example with regard to the variation of Vth (also called a ΔVth).

FIG. 13 is a view showing the result of the simulation by investigating the variation in Vth (also called ΔVth) of the interference between the neighboring memory cells for the memory cells of the present invention and the comparison example. In FIG. 13, the horizontal axis shows Vth(V) while the vertical axis shows ΔVth(mv).

As can be seen from FIG. 13, the memory cell having the ESCG structure of the present invention shows ΔVth that is 50% of that of the flash memory cell of the comparison example. In the case of the comparison example, a reduced minimum machining size cannot suppress the interference between the neighboring memory cells. In contrast with this, the memory cell having the ESCG structure of the present invention can use the shield effect by the control gate 4 to suppress the interference between the neighboring memory cells. Therefore, the memory cell of the present invention can suppress the interference between the neighboring memory cells even when the minimum machining size is reduced.

Second Embodiment

Figure 14:
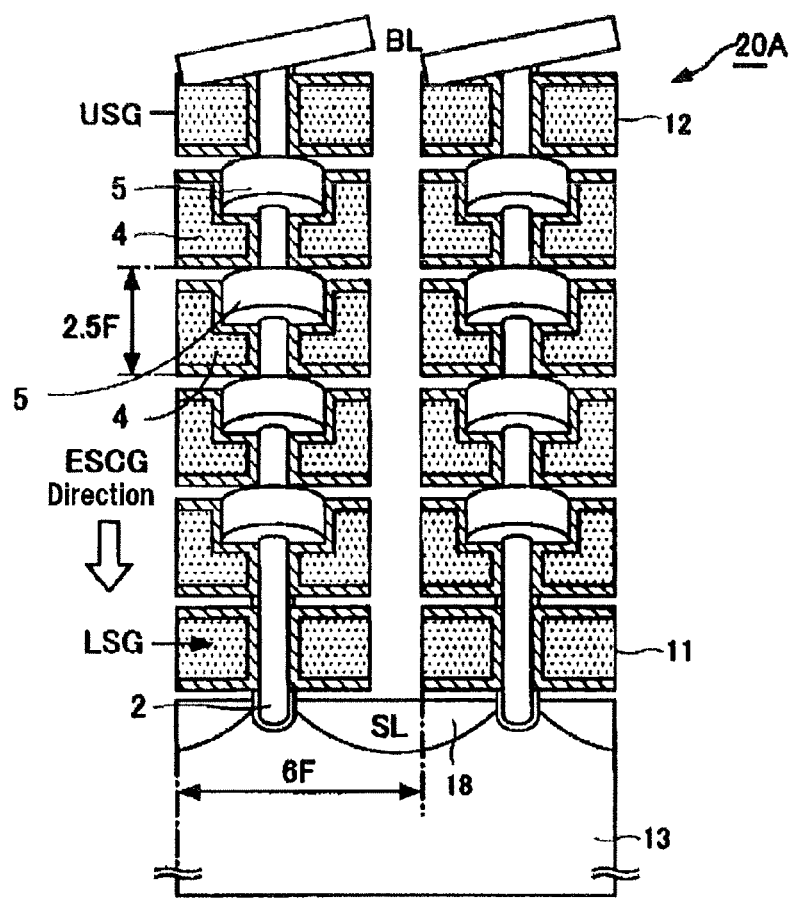
FIG. 14 is a schematic view illustrating the configuration of the memory cell according to the modification example of the second embodiment of the present invention.

FIG. 14 is a schematic view illustrating the configuration of a memory cell string 20A according to the second embodiment of the present invention.

As shown in FIG. 14, the second control gate 4B of each memory cell is provided, in contrast with the memory cell 1 of FIG. 1, at the lower side of the floating gate 5. The other configurations of the memory cell are the same as those of the memory cell 1 of FIG. 1 and will not be described further. This memory cell has an advantage in that, during the writing operation to the cell by the neighboring semiconductor pillar 2, the malfunction of the writing to the cell closest to the source line (SL) (program disturbance) can be prevented. Furthermore, the cells shown in FIG. 14 also can be used for a multi-bit production method. Thus, the cell array control or a further-reduced area required for 1 bit can be achieved for example.

Third Embodiment

Next, the following section will describe the memory 10A according to the third embodiment of the present invention.

Figure 15:
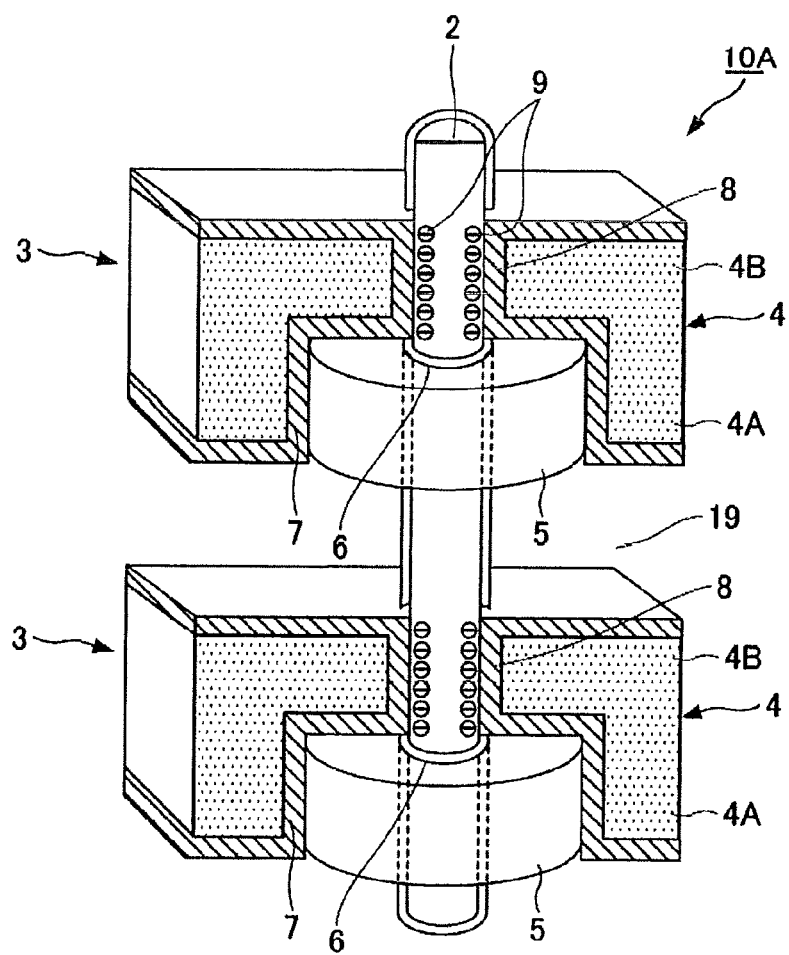
FIG. 15 is a schematic view illustrating the configuration of the memory cell according to the third embodiment of the present invention.

FIG. 15 is a schematic view illustrating the configuration of the memory 10A according to the third embodiment of the present invention.

As shown in FIG. 15, the control gate 4 at the upper side of the memory cell 10A and the control gate 4 at the lower side of the memory cell 10A have therebetween a gap or a low-dielectric-constant layer 19. The other configurations of the memory cell are the same as those of the memory cell 1 of FIG. 1 and will not be described further. Thus, the interference effect caused between neighboring memory cells can be further effectively prevented by the insertion of the gap or the low-dielectric-constant layer 19. Furthermore, the cells shown in FIG. 15 also can simplify a multi-bit production method. Thus, the cell array control or a further-reduced area required for 1 bit can be achieved for example.

Fourth Embodiment

Figure 16:
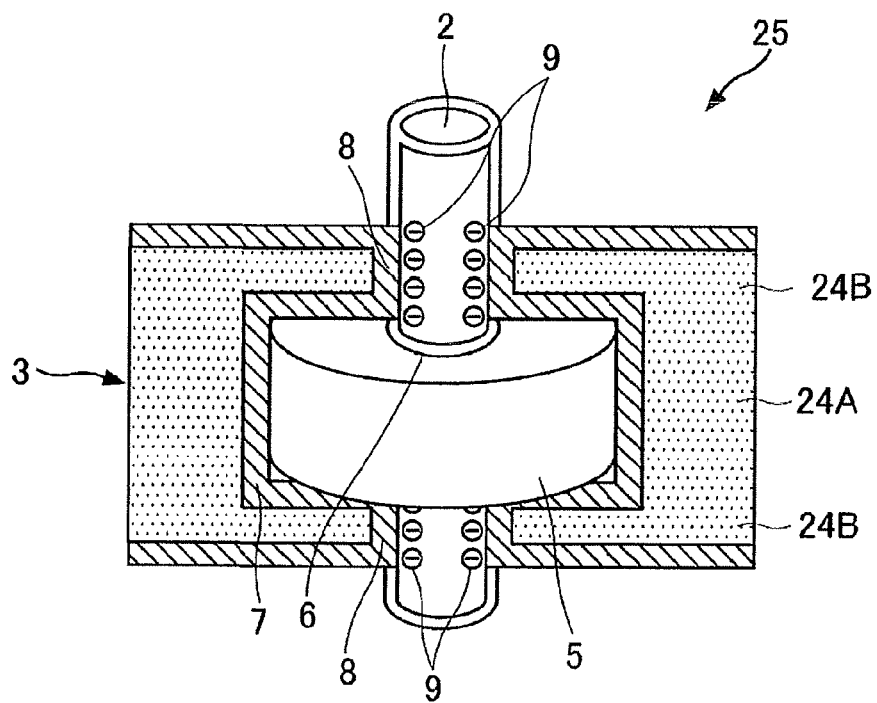
FIG. 16 is a schematic view illustrating the configuration of the memory cell according to the fourth embodiment of the present invention.

FIG. 16 is a schematic view illustrating the configuration of a memory cell 25 according to the fourth embodiment of the present invention.

As shown in FIG. 16, the memory cell 25 has a control gate 24 structured so that a first control gate 24A is sandwiched between second control gates 24B provided along the up-and-down direction of the floating gate 5. Specifically, the control gate 24 has an annular shape having a substantially square u-like cross section. The second control gate 24B of the control gate 24 surrounds the p-type semiconductor pillar 2. The other configurations of the memory cell are the same as those of the memory cell 1 of FIG. 1 and will not be described further.

According to this memory cell 25, the regions of the p-type semiconductor pillar 2 opposed to the control gate 24 (i.e., the respective regions at the upper side and the lower side of the floating gate 5) have the inversion layers 9, respectively, thus forming two ESCG structures. In other words, one memory cell 25 can have two ESCG structures.

These ESCG structures function as a source and a drain of the memory cell 25. Furthermore, in addition to the effect of the cell shown in FIG. 1, the floating gate and the control gate can have an increased capacity coupling rate. Thus, a cell performance (e.g., a writing speed) can be further improved. Furthermore, the cell shown in FIG. 16 can simplify a multi-bit production method. Thus, the cell array control or a further-reduced area required for 1 bit can be achieved for example.

Fifth Embodiment

Figure 17:
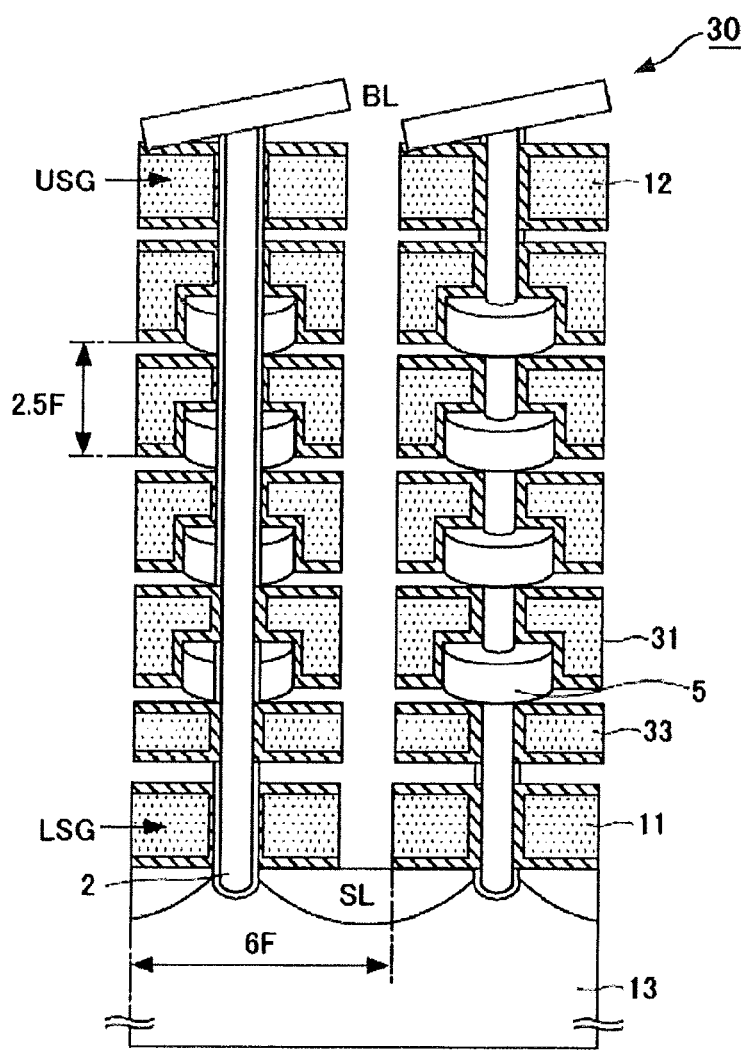
FIG. 17 is a schematic view illustrating the configuration of the memory cell according to the fifth embodiment of the present invention.

FIG. 17 is a schematic view illustrating the configuration of a memory cell string 30 according to the fifth embodiment of the present invention.

As shown in FIG. 17, the memory cell string 30 is configured so that a memory cell 31 at the bottom side has a pseudo control gate 33 (also called a dummy control gate) at the lower part of the floating gate 5. The pseudo control gate 33 functions to provide a symmetric magnitude of the coupling capacitance caused between neighboring memory cells 31 in the up-and-down direction. Thus, according to the memory cell string 30, the coupling rate (=C(fg−cg)/Ctot) of the cell that is closest to the source line (SL) side and that is represented by the formula (2) can be caused to correspond to the coupling rates of other cells. Furthermore, the pseudo control gate 33 can be used to electrically form a diffusion layer and the hot carrier injection from the LSG side to the bottom cell can be suppressed. Furthermore, the memory cell string 30 can simplify a multi-bit production method and the cell array control or a further-reduced area required for 1 bit can be achieved for example.

Sixth Embodiment

Figure 18:
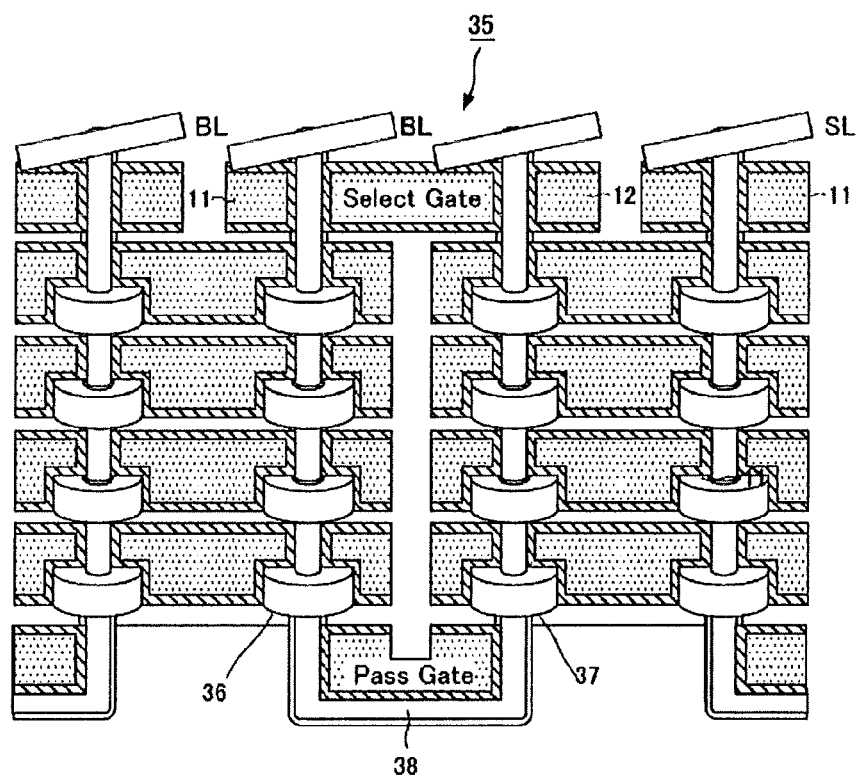
FIG. 18 is a schematic view illustrating the configuration of the memory cell according to the sixth embodiment of the present invention.

FIG. 18 is a schematic view illustrating the configuration of a memory cell string 35 according to the sixth embodiment of the present invention.

As shown in FIG. 18, the memory cell string 35 is configured so that left and right 4 bit memory cell strings 36 and 37 are configured as a pair by a pass transistor 38 and has an 8 bit memory capacity. The uppermost layer of the memory cell string 35 has the source line SL and the bit line BL. Furthermore, the lowermost layers of the left and right 4 bit memory cell strings 36 and 37 have the pass transistor 38. This pass transistor can use a vertical MOS transistor.

The first select gate transistor 11 and the second select gate transistor 12 shown in FIG. 18 are the same gates as the first select gate transistor 11 and the second select gate transistor 12 provided at the upper and lower sides of the memory cell string shown in FIG. 2(A). The first select gate transistor 11 and the second select gate transistor 12 are a control gate to select the semiconductor pillar 2 connected to specific bit line and source line. Thus, data can be externally inputted to the semiconductor pillar 2 selected by the first select gate transistor 11 and the second select gate transistor 12 or data can be externally outputted from the semiconductor pillar 2. By the structure shown in FIG. 18, the wirings such as BL or SL can be formed at the upper side, thus simplifying the production.

Furthermore, the memory cell string 35 can simplify a multi-bit production method. Thus, the cell array control or a further-reduced area required for 1 bit can be achieved for example.

Seventh Embodiment

Figure 19:
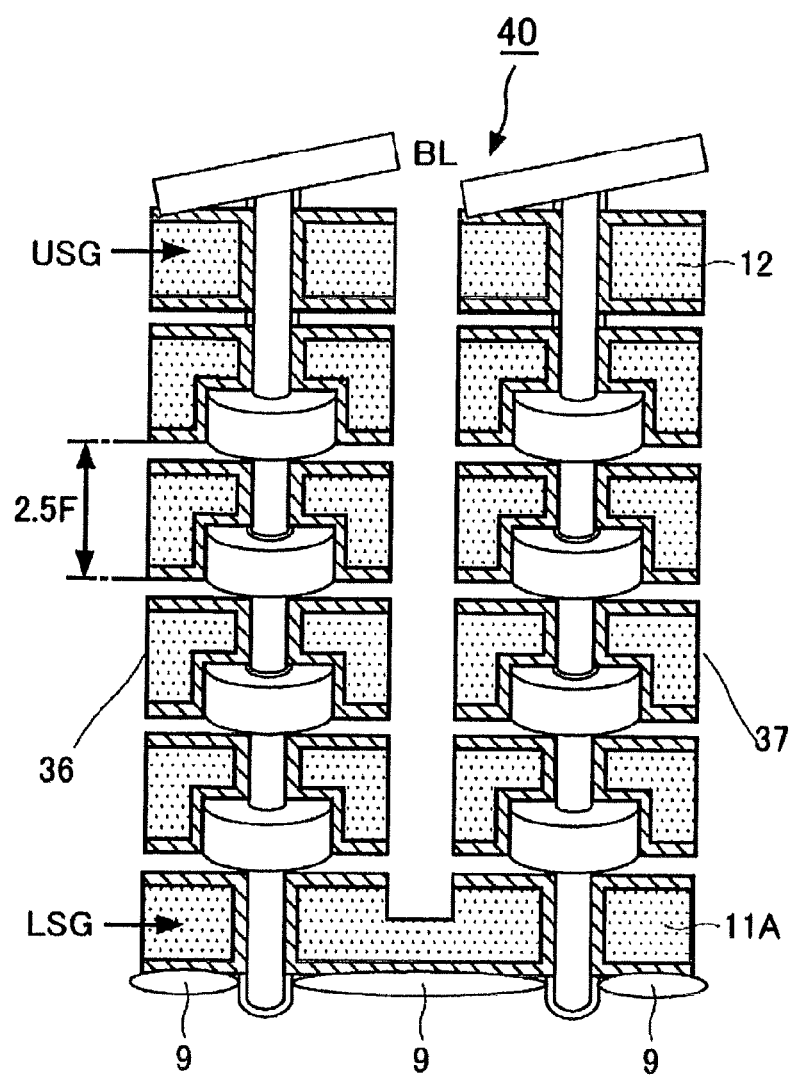
FIG. 19 is a schematic view illustrating the configuration of the memory cell according to the seventh embodiment of the present invention.
Figure 20A:
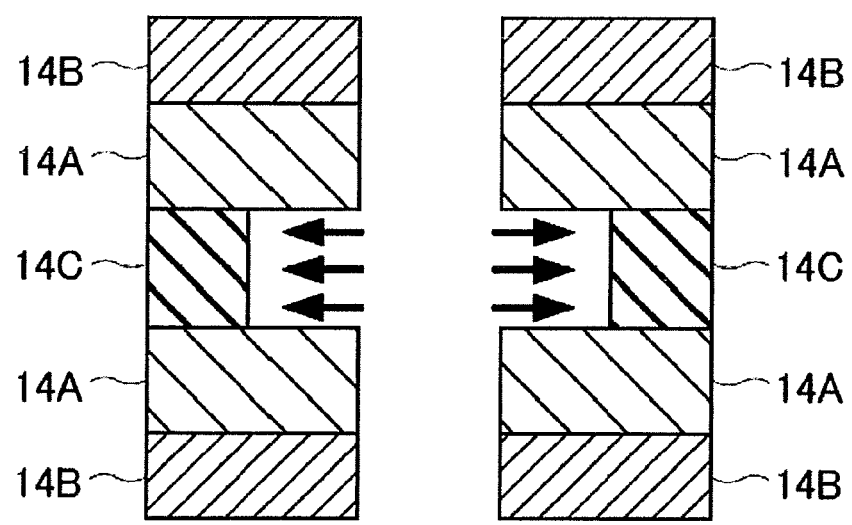
FIG. 20A is a view showing the first step of the production step of the production method of the memory cell according to the fourth embodiment.
Figure 20B:
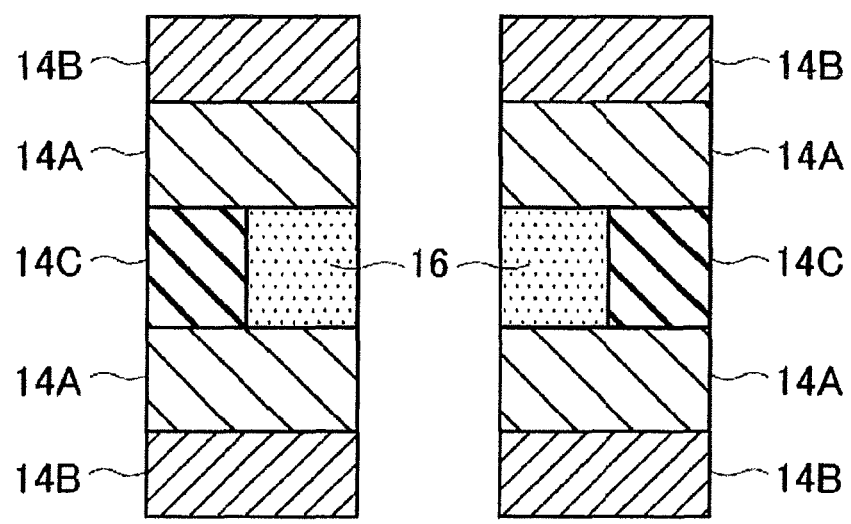
FIG. 20B is a view showing the second step of the production step of the production method of the memory cell according to the fourth embodiment.
Figure 20C:
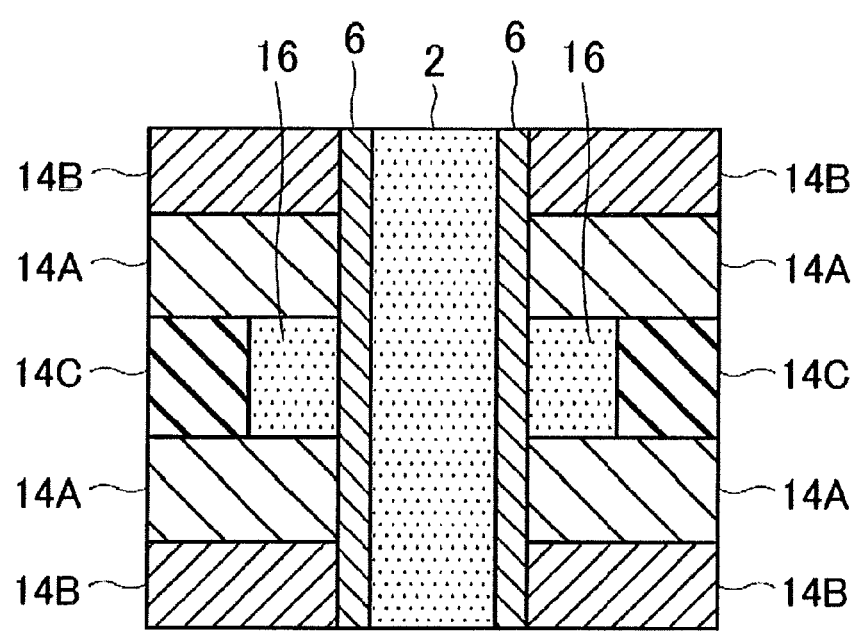
FIG. 20C is a view showing the third step of the production step of the production method of the memory cell according to the fourth embodiment.
Figure 20D:
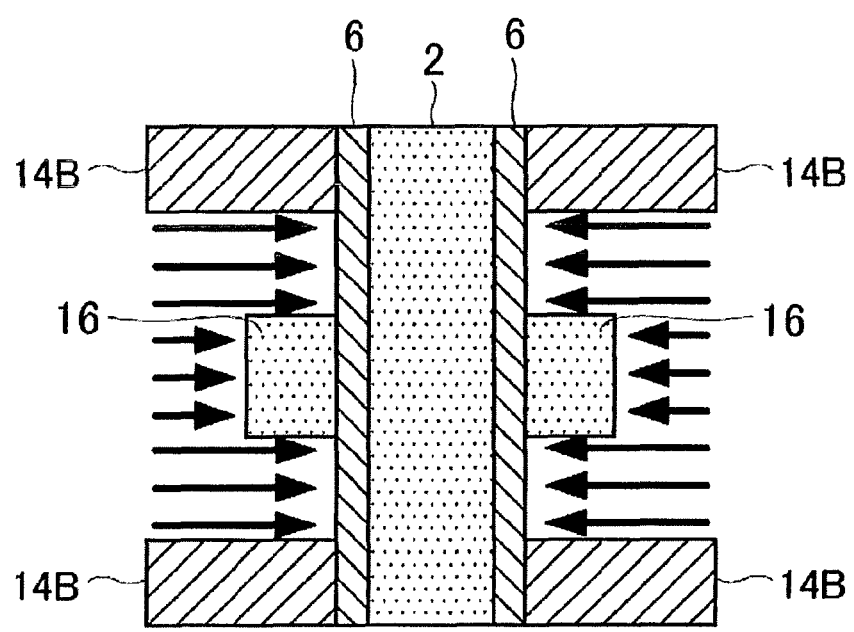
FIG. 20D is a view showing the fourth step of the production step of the production method of the memory cell according to the fourth embodiment.
Figure 20E:
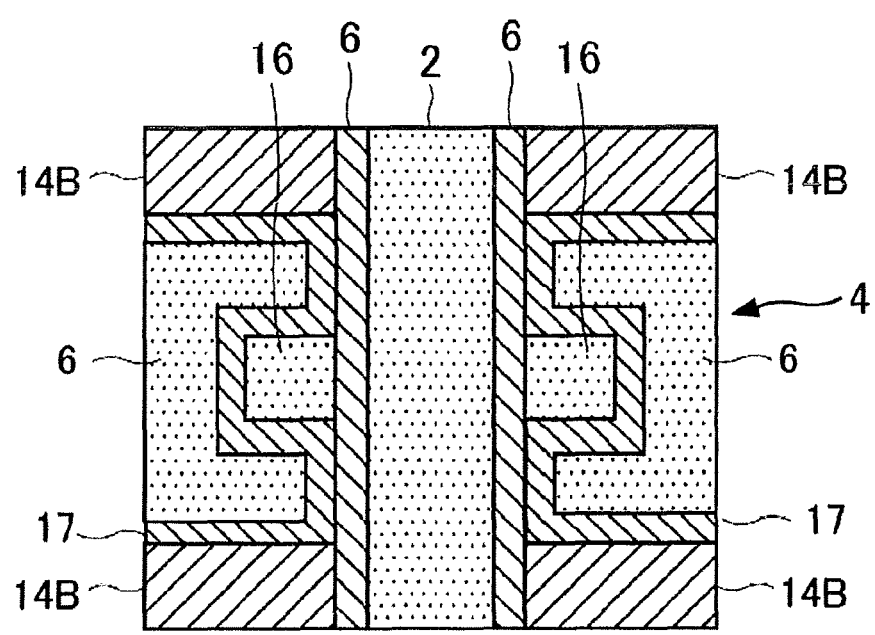
FIG. 20E is a view showing the fifth step of the production step of the production method of the memory cell according to the fourth embodiment.

FIG. 19 is a schematic view illustrating the configuration of a memory cell string 40 according to the seventh embodiment of the present invention.

As shown in FIG. 19, the memory cell string 40 is configured so that the left and right 4 bit memory cell strings 36 and 37 are configured as a pair by the first select gate transistor 11A provided at the bottom side. The memory string 40 has an 8 bit memory capacity. The first select gate transistor 11A forms the inversion layer 9 between the gate oxidized film and the substrate 13. Thus, the first select gate transistor 11A has an ESCG structure. By this ESCG structure, the source line SL can be formed on the substrate 13. Thus, the memory cell string 35 can prevent the short channel effect of the first select gate transistor 11A. Furthermore, no step is required to form the source line SL by a diffusion step for example. According to the memory cell string 40, the source line SL side is also electrically inverted. Thus, the production method can be simplified and the source line SL having a low resistance can be realized.

The following section will describe the method of producing the memory cell 25 having a substantially square u-like annular shape shown in FIG. 16.

FIG. 20A to FIG. 20E show the production method of the memory cell 25 shown in FIG. 16. The memory cell 25 can be produced by the following steps.

Production step 1: The production step 1 is a step of layering, on the substrate 13 subjected to a predetermined processing, the film layers 14 composed of 5 layers to perform an anisotropic etching on a region in which semiconductor pillar is to be formed to subsequently perform an isotropic etching (see FIG. 20A). During this, the first insulating layer 14A, the second insulating layer 14B, and the third insulating layer 14C constituting the film layers 14 have selectivity to the respective etchings. The insulating layers 14 composed of the 5 layers is composed, in an order from the lower side, the second insulating layer 14B, the first insulating layer 14A, the third insulating layer 14C, the first insulating layer 14A, and the second insulating layer 14B. The production step 1 performs an isotropic etching on the third insulating layer 14C.

Production step 2: The production step 2 is a step of depositing poly Si 16 functioning as a floating gate (see FIG. 20B).

Production step 3: The production step 3 is a step of depositing, in an opening section, the tunnel insulating film 6 and poly Si 16 functioning as the semiconductor pillar 2 (see FIG. 20C).

Production step 4: The production step 4 is a step of removing the first insulating layer 14A and the third insulating layer 14C by an isotropic etching (see FIG. 20D).

Production step 5: The production step 5 is a step of depositing the insulating film 17 and the poly Si 16 (see FIG. 20E). The control gate 4 is formed in which the deposited poly Si 16 has a cross section having a substantially square u-like shape.

The above-described first to seventh embodiments can be modified in various manners. For example, the floating gate is not limited to the case where it circumferentially covers the side face of the semiconductor pillar via the insulating layer on the outer circumference of the semiconductor pillar. The floating gate also may cover a part of the side face of the semiconductor pillar.

The control gate is not limited to the case where it circumferentially covers the semiconductor pillar via the insulating layer on the outer circumference of the semiconductor pillar and circumferentially covers the floating gate via the insulating layer on the side face of the floating gate. The control gate also may cover a part of the side face of the semiconductor pillar via the insulating layer on the outer circumference of the semiconductor pillar and may cover a part of the side face of the floating gate via the insulating layer on the side face of the floating gate. The control gate also may cover the upper face or the lower face or a part of the upper and lower faces of the floating gate.

The following section will describe the eighth to eleventh embodiments for a semiconductor integrated circuit. This semiconductor integrated circuit solves the interference issue having a direct influence from the floating gate of the neighboring cell to the channel region of the selected cell, has a low dependency on a source or drain region electrically controlled by the threshold voltage of the selected cell, and can easily adjust the charge amount of the floating gate. This semiconductor integrated circuit can provide, by adjusting the charge amount of the floating gate, a multivalued operation in which a plurality of pieces of bit information are stored in one memory cell.

Eighth Embodiment

Figure 21:
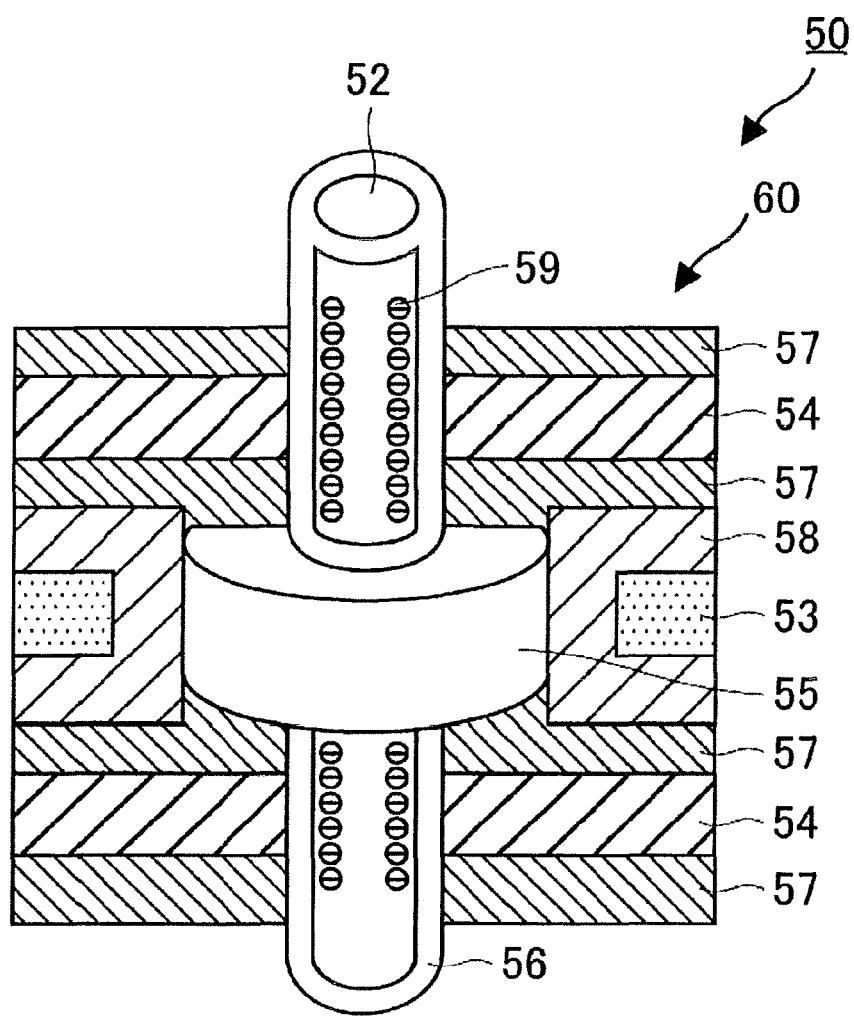
FIG. 21 is a perspective view illustrating the device structure of one memory cell provided in the semiconductor integrated circuit according to the eighth embodiment of the present invention.

FIG. 21 is a perspective view illustrating the device structure of one cell of a memory cell 60 provided in a semiconductor integrated circuit 50 according to the eighth embodiment of the present invention.

As shown in FIG. 21, the memory cell 60 provided in the semiconductor integrated circuit 1 includes: a semiconductor pillar 52 that serves as a channel; a floating gate 55 that circumferentially covers the side face of the semiconductor pillar 52 or covers a part thereof via an insulating layer 56 on the outer circumference of the semiconductor pillar 52; a main control gate 53 that circumferentially covers the side face of the floating gate 55 or covers a part thereof via an insulating layer 58 on the outer circumference of the floating gate 55; a source/drain control gate 54 that circumferentially covers the side face of the semiconductor pillar 52 or covers a part of thereof via the insulating layers 56 and 57 on the outer circumference of the semiconductor pillar 52 at the upper face or the lower face of the floating gate 55; the insulating layer 57 provided between the floating gate 55 and the source/drain control gate 54; and the insulating layer 57 provided between the main control gate 53 and the source/drain control gate 54. In this embodiment, the insulating layer 56 provided between the semiconductor pillar 52 and the floating gate 55 is a tunnel insulating layer and will be called the tunnel insulating layer 56 unless otherwise specified. As insulating layers other than this, the insulating layer 57 is provided between the main control gate 53 and the source/drain control gate 54 and the insulating layer 58 is provided between the floating gate 55 and the main control gate 53. The respective insulating layers of the tunnel insulating layer 56 and the insulating layers 57 and 58 also may be collectively called the insulating layer or an insulating film. The memory cell 60 is a so-called vertical memory cell. The main control gate 53 also may be called the first control gate and the source/drain control gate 54 also may be called the second control gate. The source/drain control gate means any of a source control gate or a drain control gate.

This semiconductor pillar 52 can be formed on a substrate composed of a semiconductor such as Si or an SOI substrate (not shown). The semiconductor pillar 52 can be made of silicon (Si) for example and also may be called the silicon pillar 52. The semiconductor pillar 52 that serves as a channel may include a p-type or n-type semiconductor pillar. The following description will describe the semiconductor pillar 52 that serves as a channel assumed as a p-type semiconductor. The semiconductor pillar 52 may have an impurity density of $1 \times 10^{15}$ cm$^{-3}$ or more and $1 \times 10^{22}$ cm$^{-3}$ or less.

The tunnel insulating layer 56 has a thickness of about 2 nm to 20 nm. The insulating layer 58 between the outer circumference section of the floating gate 55 and the main control gate 53 and the insulating layer 57 between the main control gate 53 and the source/drain control gate 54 have a thickness of about 5 nm to 100 nm.

The eighth embodiment of the present invention is characterized in that the gate of the memory cell includes the source/drain control gate 54. This will be described in detail.

The inner circumference section of the source/drain control gate 54 is opposed, via the insulating layer 56, to the surface of the p-type semiconductor pillar 52. Thus, when a voltage is applied to the source/drain control gate 54, such electrons are induced over the surface of the p-type semiconductor pillar 52 that have an opposite conductivity type to that of the holes functioning as many carriers of the p-type semiconductor pillar 52, thus forming a so-called inversion layer 59.

As a result, a region including many electrons is formed in the surface of the p-type semiconductor pillar 52, resulting in a status equivalent to the status in which a very shallow n-type diffusion region is formed. This inversion layer 59 functions both as a source region of the memory cell 60 and a drain region of another memory cell formed at the upper side. The source/drain control gate 54 can function to shield neighboring memory cells, thus eliminating the parasitic capacitance between neighboring memory cells.

The source/drain control gate 54 of the present invention will be called an Extended Sidewall Control Gate (ESCG).

Furthermore, by allowing the semiconductor integrated circuit 50 to have the cell structure as shown in FIG. 21, advantages can be obtained in which the storage of multi-bit information in the cell is simplified and the cell array control or a further-reduced area required for 1 bit can be achieved for example.

Figure 22A:
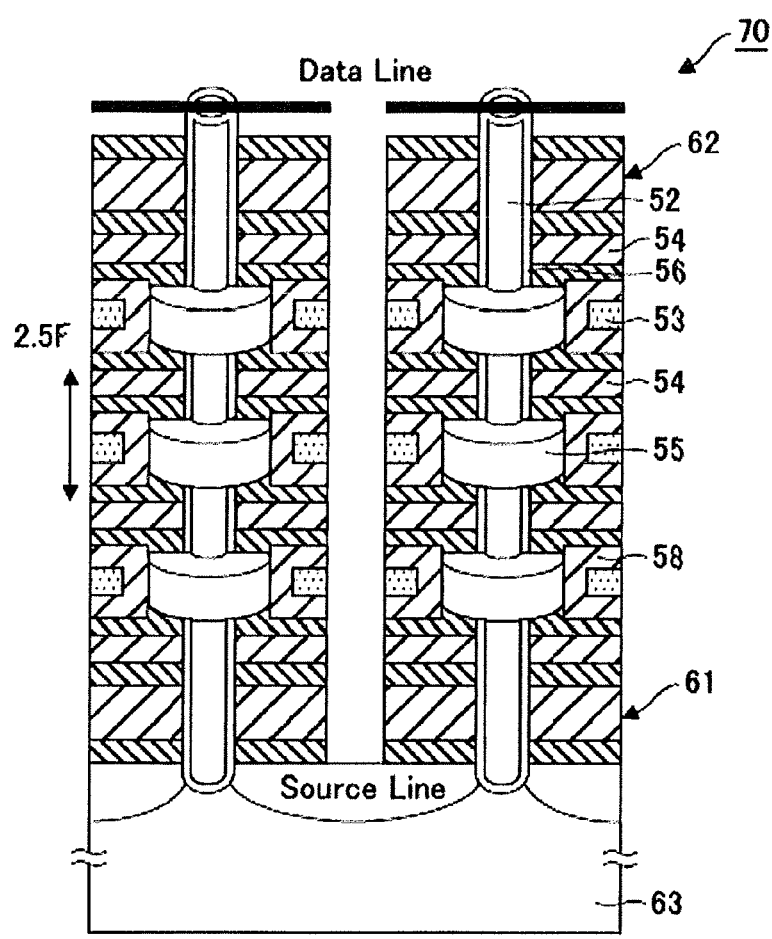
FIG. 22A is a partial cross-sectional view illustrating the device structure of the 4-bit memory using the vertical memory cell according to the eighth embodiment of the present invention.
Figure 22B:
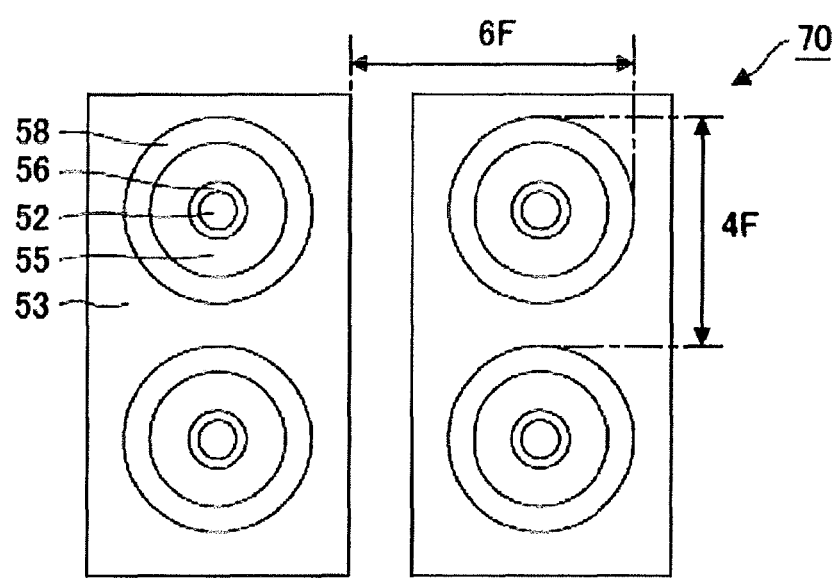
FIG. 22B is a plan view illustrating the device structure of the memory shown in FIG. 22A.
Figure 22C:
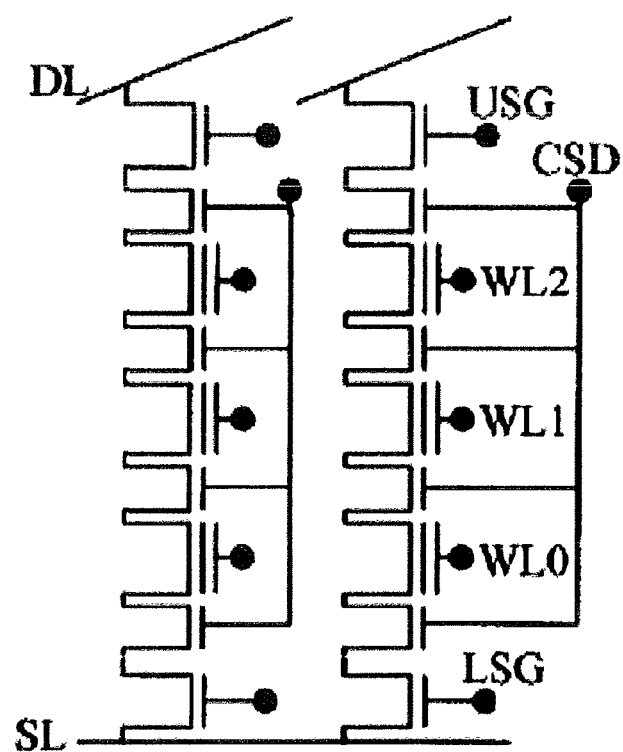
FIG. 22C is an equivalent circuit diagram illustrating the device structure of the memory shown in FIG. 22A.
Figure 23A:
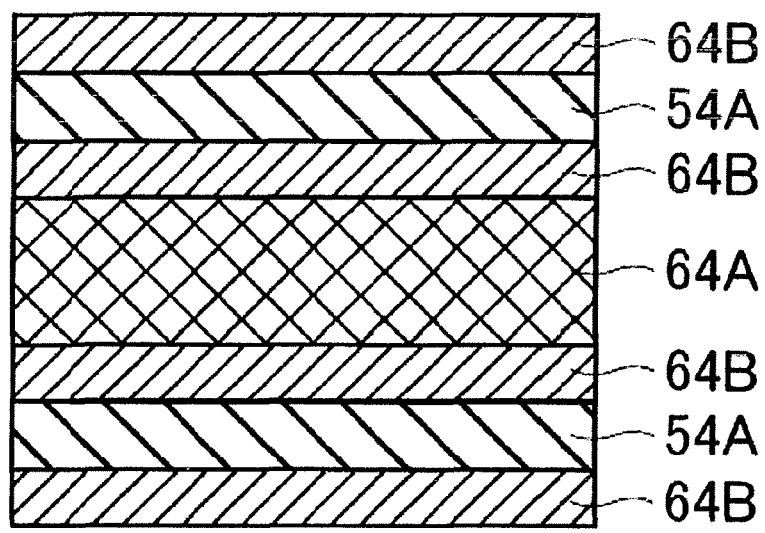
FIG. 23A is a view showing the first step of the production step of the memory cell.
Figure 23B:
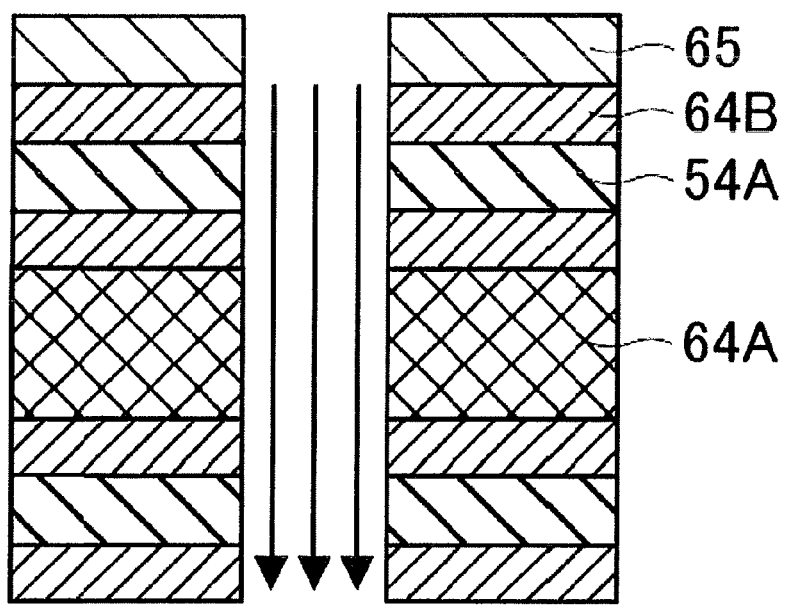
FIG. 23B is a view showing the second step of the production step of the memory cell.
Figure 23C:
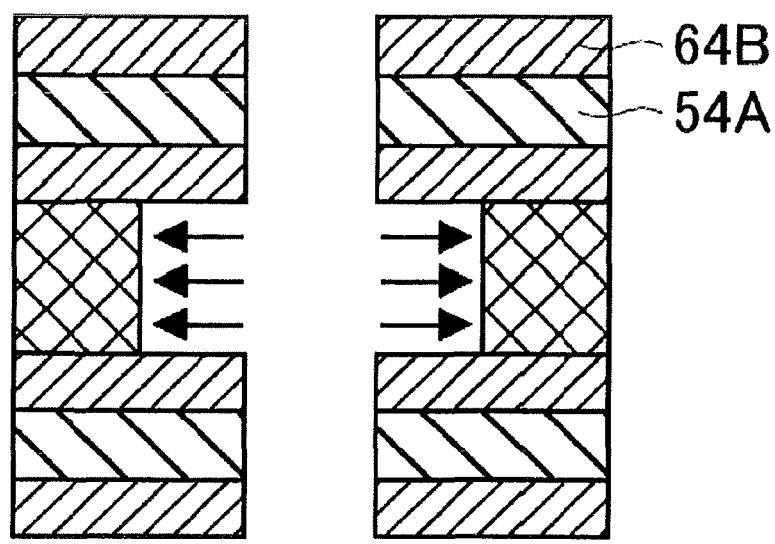
FIG. 23C is a view showing the third step of the production step of the memory cell.
Figure 23D:
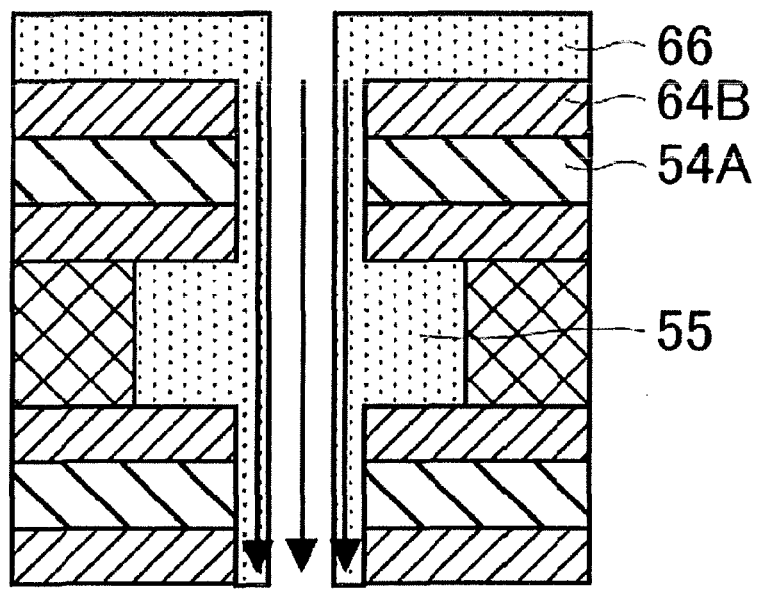
FIG. 23D is a view showing the fourth step and the fifth step of the production step of the memory cell.
Figure 23E:
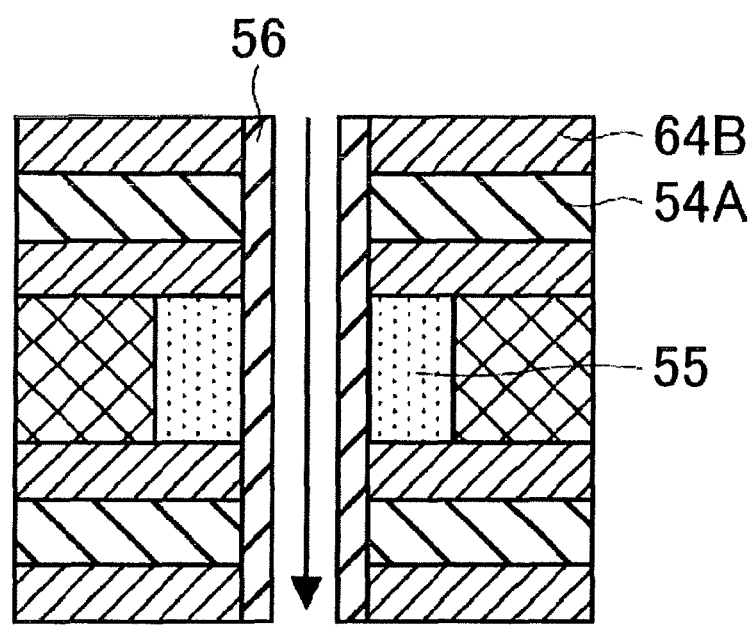
FIG. 23E is a view showing the sixth step of the production step of the memory cell.
Figure 23F:
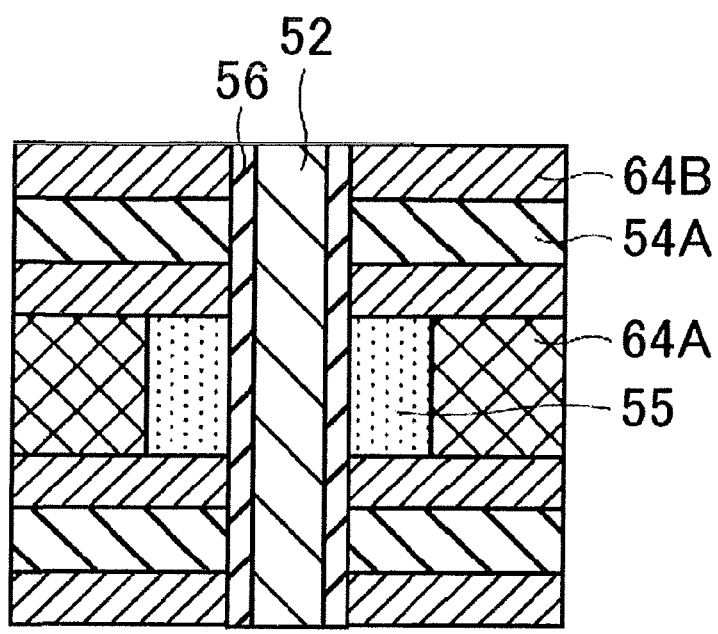
FIG. 23F is a view showing the seventh step of the production step of the memory cell.
Figure 23G:
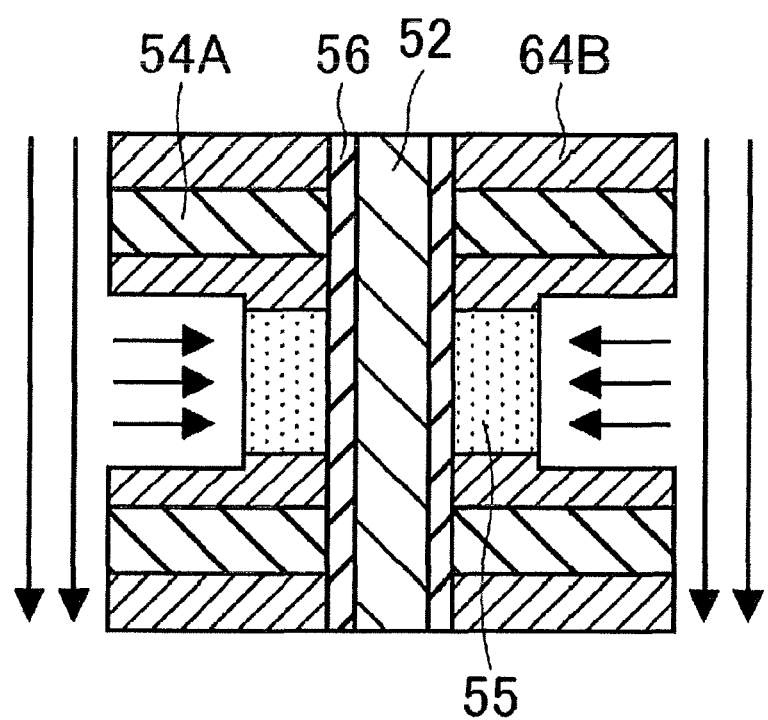
FIG. 23G is a view showing the eighth step of the production step of the memory cell.
Figure 23H:
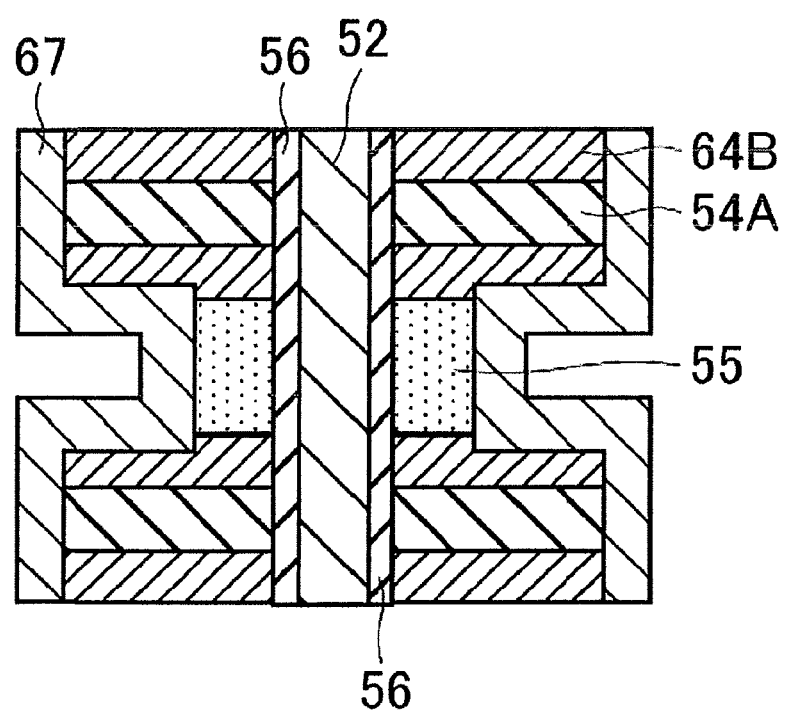
FIG. 23H is a view showing the ninth step of the production step of the memory cell.
Figure 23I:
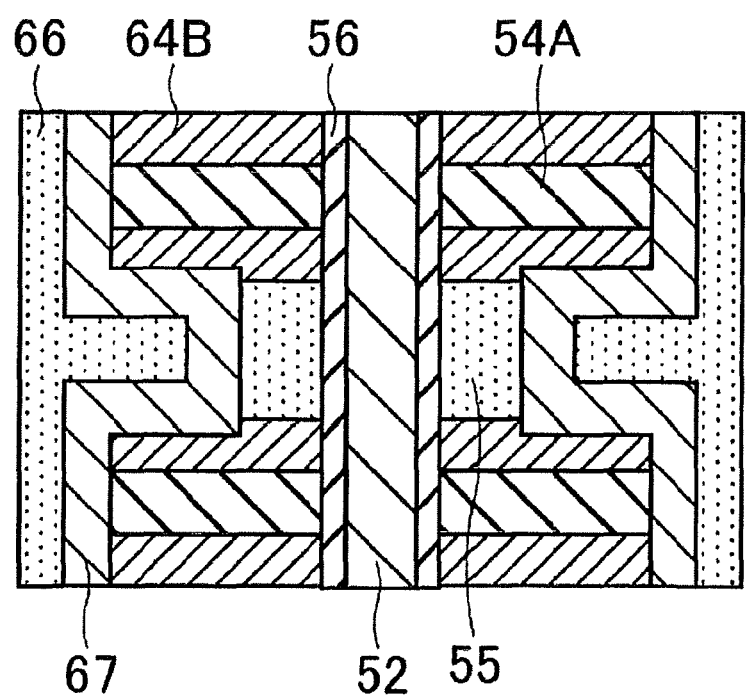
FIG. 23I is a view showing the first half of the tenth step of the production step of the memory cell.
Figure 23J:
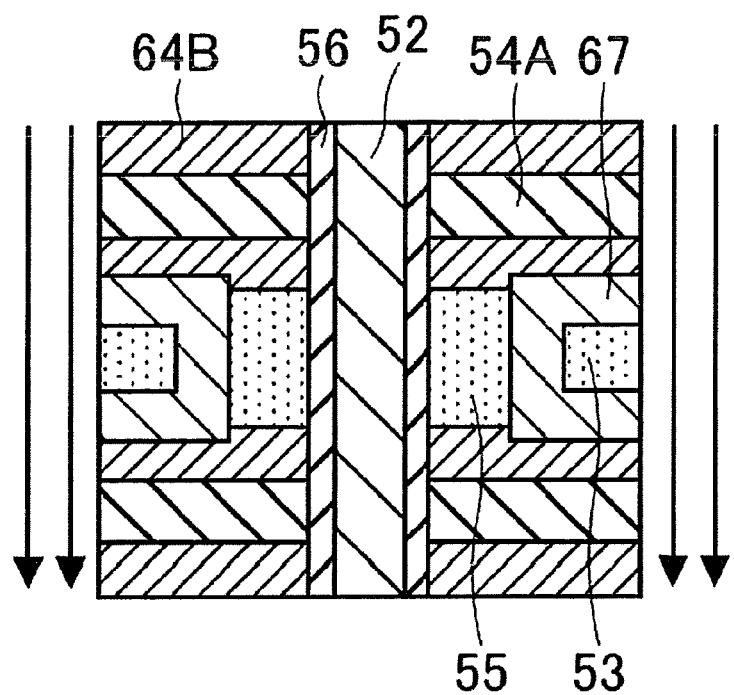
FIG. 23J is a view showing the second half of the tenth step of the production step of the memory cell.

FIG. 22A is a partial cross-sectional view illustrating the device structure of a 3 bit memory using the vertical memory cell according to the eighth embodiment of the present invention. FIG. 22B is a plan view illustrating the device structure of the memory shown in FIG. 22A. FIG. 22C is an equivalent circuit diagram illustrating the memory shown in FIG. 22A.

As shown in FIG. 22A, a memory 70 includes 3 memory cells shown in FIG. 21 serially connected in the axial direction of the p-type semiconductor pillar 52.

A first select gate transistor 61 is provided between the bottom memory cell and a substrate 63. The source of the first select gate transistor 61 is provided in the n-type diffusion region of the substrate 63, thus forming a source line. The top memory cell has thereon a second select gate transistor 62. The drain of the second select gate transistor 62 forms a bit line (data line).

The first select gate transistor 61 and the second select gate transistor 62 are a vertical n-channel MOS transistor. The first select gate transistor 61, the three memory cells and the second select gate transistor 62 are serially-connected, thus constituting the memory cell string.

As shown in FIG. 22B, the 3 bit memory cell string has the minimum machining area having a lateral size of 6F and a longitudinal size of 4F calculated as 24F$^2$ when assuming that the minimum machining size is F. The minimum machining size is about 2× nm as the minimum machining size of the next generation. Although X is not determined, F is about 22 nm when X is about 70 percent of the current 32 nm process.

In order to form the source/drain control gate 54 functioning as an ESCG, one memory cell has a height of about 2.5F. The minimum machining area required to form a NAND structure string is larger than the charge trap-type vertical memory cell. However, the bit cost of the memory of the present invention is significantly lower than that of the flash memory cell of the conventional plane NAND structure when the bit number is 8 bit or more.

The production method of the memory cell of the present invention can be carried out through the following steps. FIG. 23A to FIG. 23J show the main steps of the production method of the memory cell. FIG. 24A to FIG. 24F show the main steps of the production method of the memory cell array when three cells are layered.

First step: The first step is a step of layering, on the substrate 63 subjected to a predetermined processing, the layer 54A functioning as the source/drain control gate 54 and two different types of insulating layers 64 as shown (see FIG. 23A and FIG. 24A).

The two different types of insulating layers 64 are composed of the first insulating layer 64A and the second insulating layer 64B. The first insulating layer 64A is a $SiO_2$ layer for example. The second insulating layer 64B is a $Si_3N_4$ layer for example. The materials of the first insulating layer 64A and the second insulating layer 64B are not limited to the above-described example. Specifically, the first insulating layer 64A and the second insulating layer 64B may be composed of any materials so long as the materials can be selectively etched to one another in an isotropic etching.

On the substrate 63, the second insulating layer 64B, a layer functioning as the source/drain control gate 54 (hereinafter simply referred to as a "gate formation layer") 54A, the second insulating layer 64B, the first insulating layer 64A, the second insulating layer 64B, the gate formation layer 54, and the second insulating layer 64B are layered in this order. Specifically, a layer in which the main control gate 53 and the floating gate 55 are formed (i.e., the first insulating layer 64A) is sandwiched among the second insulating layers 64B, the gate formation layers 54A, and the second insulating layers 64B layered in this order at the upper and the lower sides, respectively.

Second step: The second step is to form a line and a space in the layered layers by the resist 65 for example. Then, an opening is provided up to the surface of the substrate 63. Then, an anisotropic etching is performed on a region in which the semiconductor pillar 52 and the tunnel insulating film 56 are formed among the layered layers adjacent to this opening (see FIG. 23B). The anisotropic etching can be performed by a reactive ion etching (RIE).

Third step: The third step is a step of subjecting, from among the insulating layers layered adjacent to the opening, the first insulating layer 64A in a region functioning as the floating gate 55 to an isotropic etching (see FIG. 23C and FIG. 24B). The isotropic etching can be performed by a chemical etching using chemical solution.

Fourth step: The fourth step is a step of depositing, on the opening, the semiconductor material 66 functioning as the floating gate 55 including a region functioning as the control gate 54 (see FIG. 23D). The semiconductor material 66 may be made of silicon material such as poly Si.

Fifth step: The fifth step is a step of subjecting, to an anisotropic etching, the region in which the semiconductor material 66 is deposited so that an opening is formed in a region in which semiconductor pillar 52 and tunnel insulating film 56 are to be formed and so that the floating gate 55 is formed (see FIG. 23D and FIG. 24C)

Sixth step: The sixth step is to deposit the tunnel insulating layer 56 at the side wall of the opening formed by the anisotropic etching (see FIG. 23E).

Seventh step: The seventh step is to deposit the semiconductor material 66 in the opening surrounded by the tunnel insulating layer 56 to form the semiconductor pillar 52 (see FIG. 23F and FIG. 24D).

Eighth step: The eighth step is to perform, from among the above two different types of layers, an isotropic etching on the first insulating layer 64A remaining next to the layer including the floating gate 55 composed of the poly Si (see FIG. 23G).

Ninth step: The ninth step is to form, on the floating gate 55, another insulating film 67 (e.g., a $SiO_2$ film) (see FIG. 23H).

Tenth step: The tenth step is to deposit, on the another insulating film 67, the material 66 to be used for the main control gate 53 (see FIG. 23I) and a step of etching this material 66 so as to form the main control gate 53 (see FIG. 23J and FIG. 24E). The materials to be used for the main control gate 53 and the source/drain control gate 54 is not limited to poly Si and also may be metal or silicide.

In FIG. 24A to FIG. 24F, when the first select gate transistor 61 and the second select gate transistor 62 are formed, attention must be paid on the following point.

The first select gate transistor 61 and the second select gate transistor 62 are select gate transistors that are provided at the top and bottom sides of the NAND string as shown in FIG. 22A and are select gates that select the specific semiconductor pillar 52. Thus, the first select gate transistor 61 and the second select gate transistor 62 do not need to include the floating gate 55. The same gate layer as the source/drain control gate 54 of the present invention can be used for the formation (see FIG. 24A to FIG. 24E).

Figure 24A:
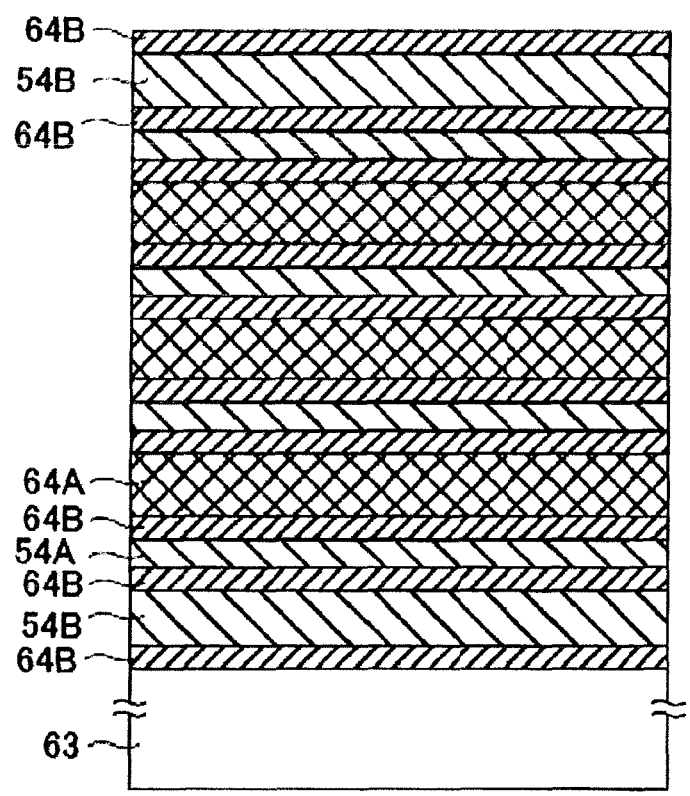
FIG. 24A is a view showing the first step of the production step of the memory cell array when three cells are layered.
Figure 24B:
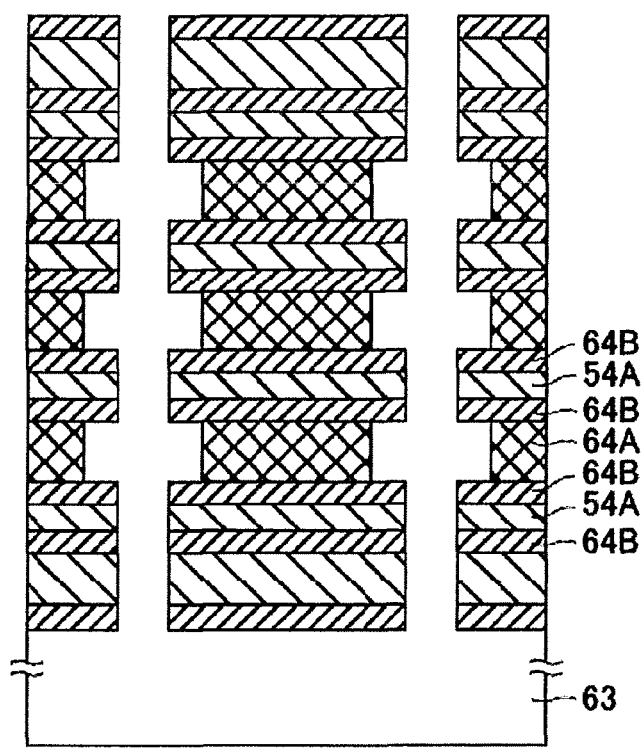
FIG. 24B is a view showing the third step of the production step of the memory cell array when three cells are layered.
Figure 24C:
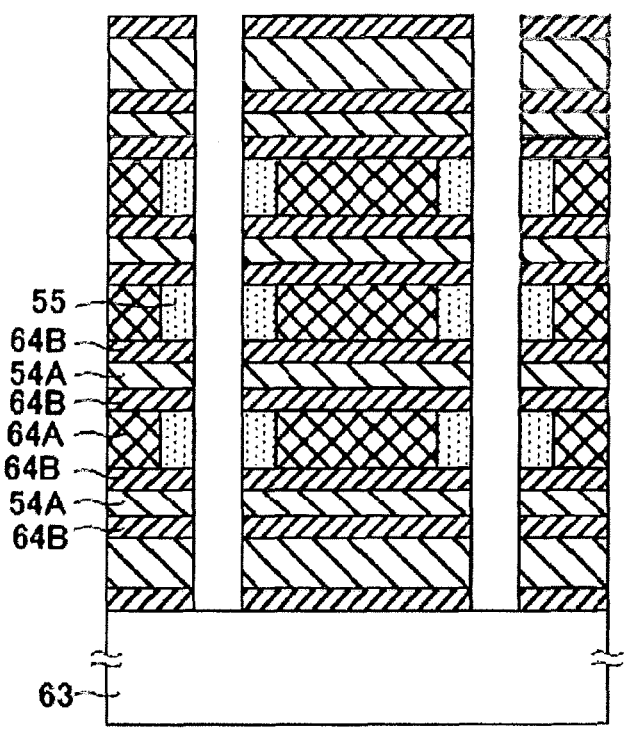
FIG. 24C is a view showing the fifth step of the production step of the memory cell array when three cells are layered.
Figure 24D:
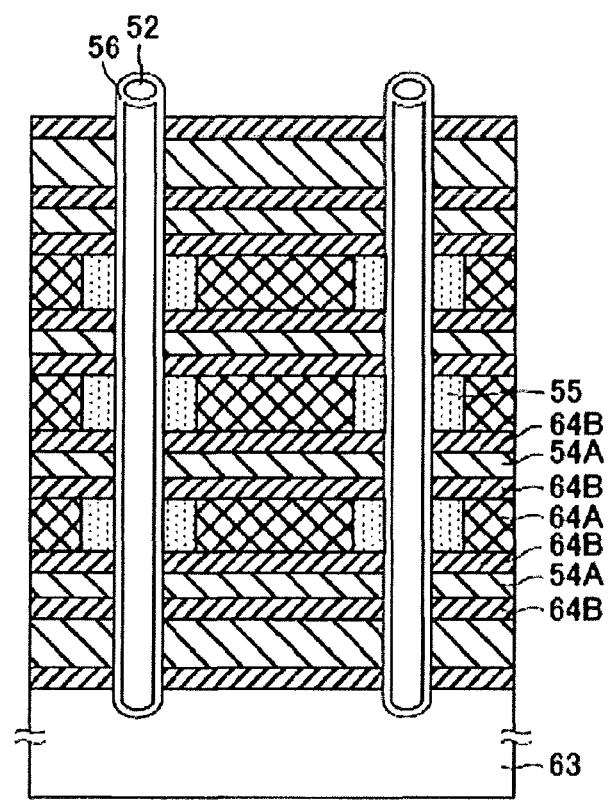
FIG. 24D is a view showing the seventh step of the production step of the memory cell array when three cells are layered.
Figure 24E:
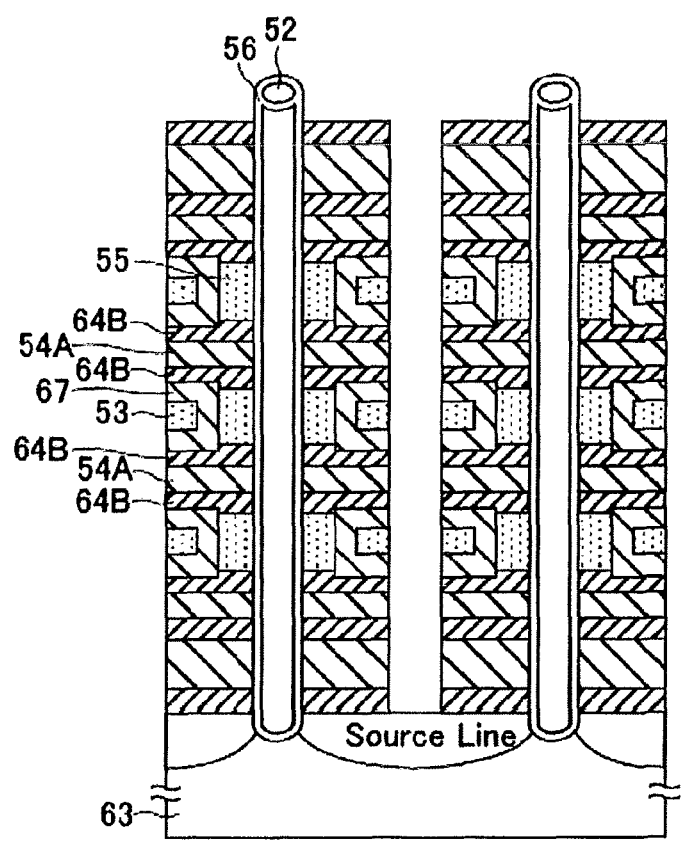
FIG. 24E is a view showing the tenth step of the production step of the memory cell array when three cells are layered.
Figure 24F:
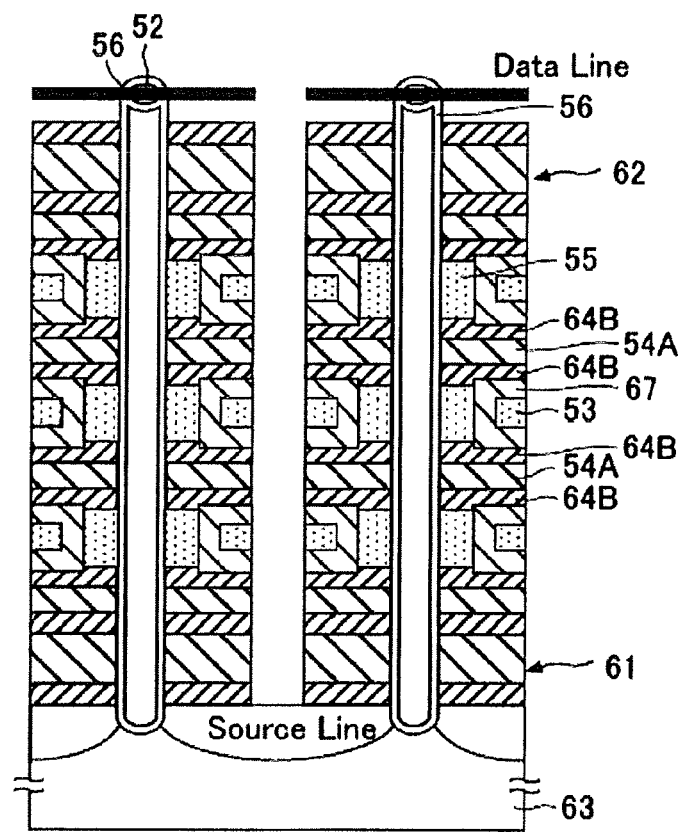
FIG. 24F is a view showing a step after the tenth step shown in FIG. 24E.

For example, with regard to the first select gate transistor 61, prior to the formation of the film layers 64, the insulating film 68 and the select gate layer 54B may be formed on the substrate 61. With regard to the second select gate transistor 65, the second insulating film 64B constituting the top memory cell may have thereon the select gate layer 54B and the second insulating film 64B. As shown in FIG. 24F, a data line for example is formed between the semiconductor pillars 52.

Figures 25A, 25B, 25C, 25D:
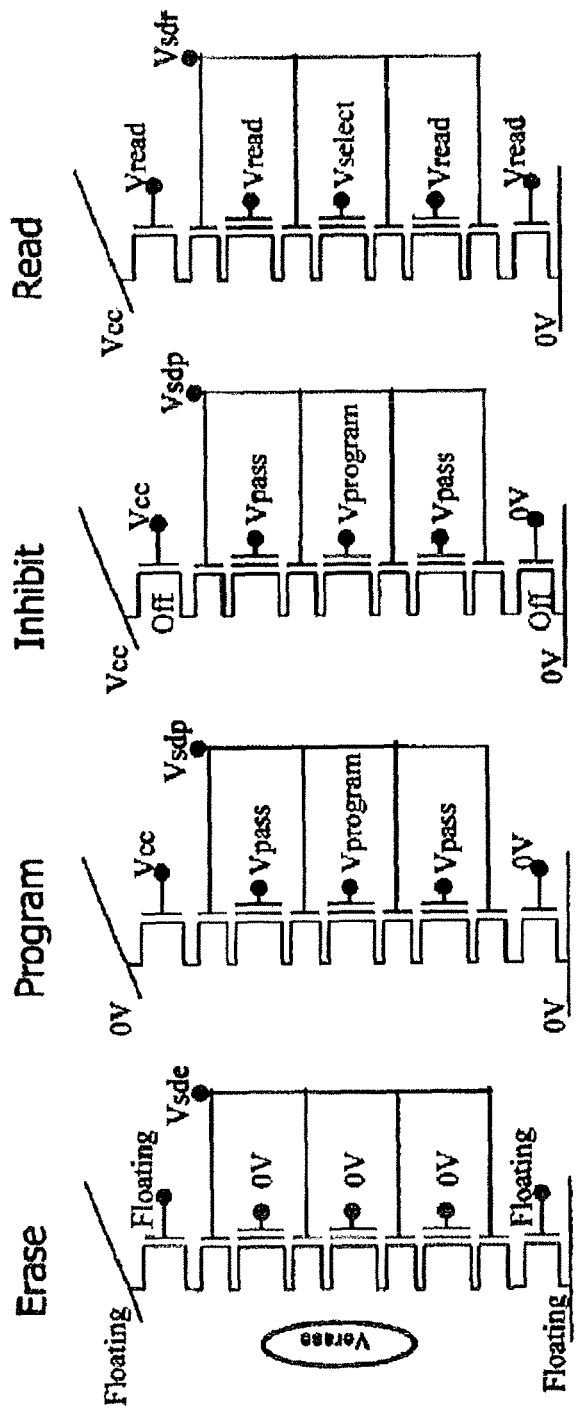
FIGS. 25(A) to 25(D) are views showing the operation of the vertical memory cell according to the eighth embodiment of the present invention.

FIGS. 25(A) to 25(D) are views showing the operation of the vertical memory cell according to the eighth embodiment of the present invention. FIG. 25(A) shows the operation in the case of erasing. FIG. 25(B) shows the operation in the case of programming. FIG. 25(C) shows the operation in the case of write inhibition. FIG. 25(D) shows the operation in the case of reading.

As shown in FIG. 25(A), the deletion from a memory cell is performed on a block basis. The deletion operation is performed by applying a voltage to the p-type semiconductor pillar to extract electrons from the floating gate 55.

As shown in FIG. 25(B), information is written to the memory cell by injecting electrons into the floating gate 55 by the quantum tunnel effect. The n-type semiconductor region of the substrate 63 (i.e., the source line SL) is allowed to have a ground potential and the writing voltage is applied to the main control gate 53 by small current. The information is stored in the electrons accumulated in the floating gate 55. The writing operation is performed on the basis of a page unit. The writing voltage is simultaneously applied to the main control gate 53 for all cells within the same page to thereby perform a writing operation.

As shown in FIG. 25(C), the operation to forbid the writing to the memory cell is an operation to prevent cells not to be written from being written during the writing operation.

As shown in FIG. 25(D), in the memory cell of the present invention, information is read on the basis of a page unit. When the floating gate 55 includes a fixed amount of electrons, slight current flows between the source and the drain and this status is assumed as "0". When the floating gate 55 does not include a fixed amount of electrons, relatively high current is allowed to flow between the source and the drain and this status is assumed as "1".

As described above, the vertical memory cell having the ESCG structure according to the eighth embodiment of the present invention can perform the memory operation similar to that by a general plane NAND flash memory cell. In particular, a bulk deletion method can be used by using the ESCG structure. Specifically, the electric n-type source/drain region formed by the ESCG structure accumulates the hole charge when a deletion voltage is applied to the bulk. As a result, the p-type semiconductor pillar 52 completely contacts with the semiconductor substrate 63 (bulk) such as Si. Thus, the memory cell of the semiconductor integrated circuit 50 can use the bulk deletion method as in the general plane NAND flash memory cell.

The following section will describe various characteristics of the memory cell of the present invention with regard to a calculation example.

Various characteristics of the memory cell of the present invention were calculated based on a three-dimensional simulation using the calculation software (TCAD) for the semiconductor integrated circuit developed by the present inventors.

Figure 26C:
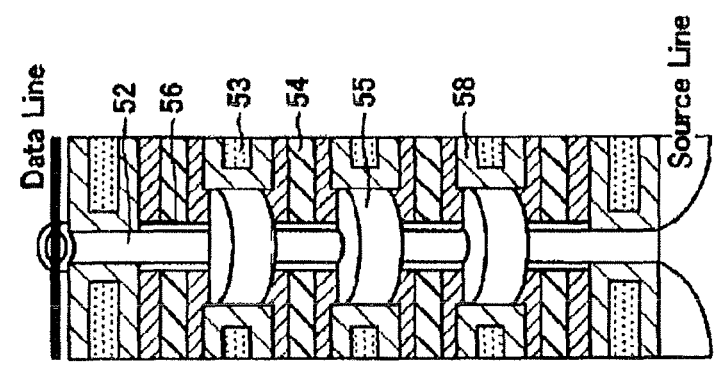
FIGS. 26(A) to 26(C) are views showing a calculation model used for simulation.
Figure 26B:
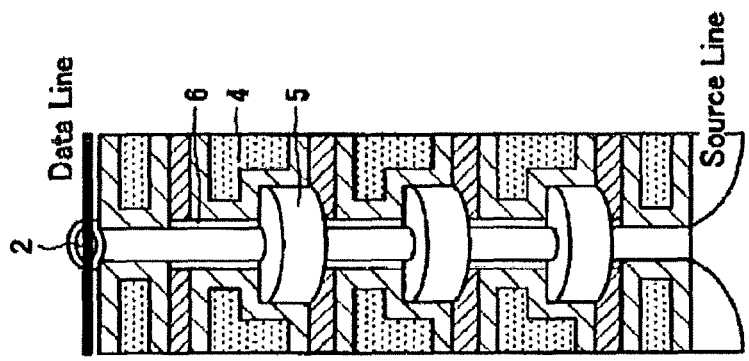
Figure 26A:
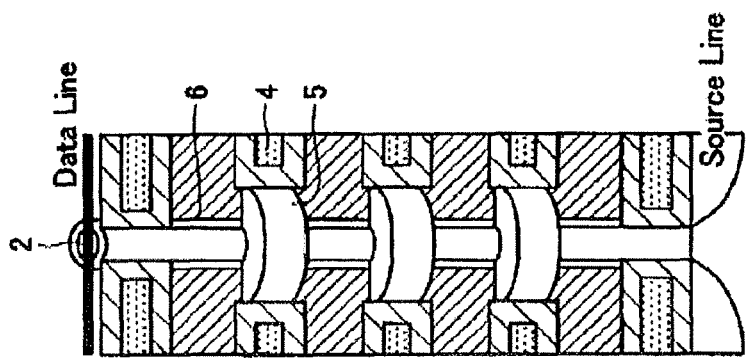

FIGS. 26(A) to 26(C) are views showing the calculation model used for the simulation. FIG. 26(A) shows a conventional FG structure of a comparison example. FIG. 26(B) shows the ESCG structure as in the first embodiment. FIG. 26(C) shows a flash memory cell of the ESCG structure according to the eighth embodiment.

Figure 27:
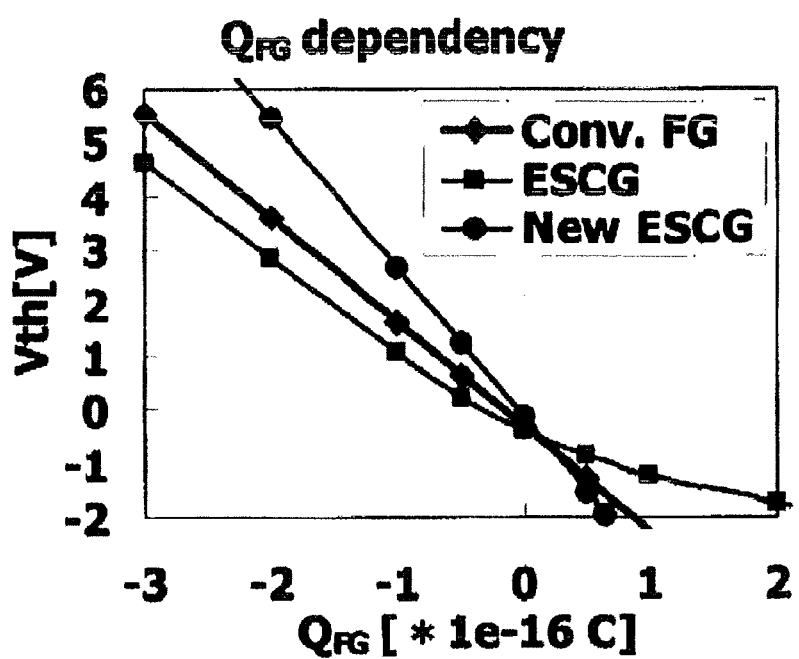
FIG. 27 is a view showing the result of the simulation of the charge injected to the floating gate of the memory cell of the present invention and shows the dependency of Vth on the charge amount of the floating gate.

FIG. 27 is a view showing the result of the simulation of the charge injected to the floating gate 55 of the memory cell of the present invention and shows the dependency of Vth on the charge amount. The horizontal axis shows the entire charge amount $Q_{FG}(C)$ in the floating gate while the vertical axis shows the simulated Vth(V). In FIG. 27, the trapezoid plots (◆) show the result of the conventional FG structure, the square plots (■) show the result of the ESCG structure as in the first embodiment, and the circle plots (●) show the result of the ESCG structure according to the eighth embodiment.

As can be seen from FIG. 27, the memory cell having the ESCG structure according to the eighth embodiment shows Vth higher than those of the flash memory cell of the comparison example and the memory cell having the ESCG structure as in the first embodiment. By adjusting the charge amount of the floating gate, the dependency of the threshold voltage of the selected cell can be also increased, thus achieving the multivalued storage for storing a plurality of pieces of bit information in one memory cell.

Figure 28:
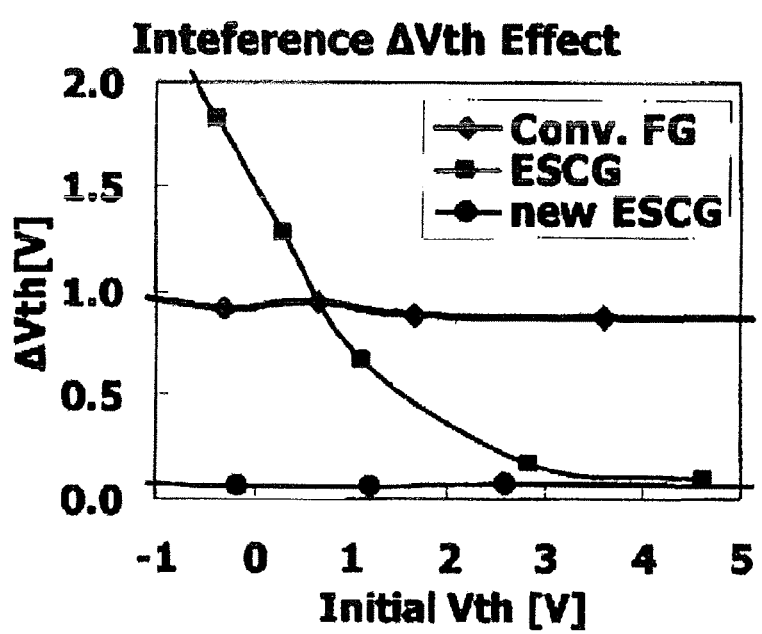
FIG. 28 is a view showing the result of the simulation of the interference between the neighboring memory cells for the memory cell of the present invention and the flash memory cell of the comparison example with regard to the variation of Vth (also called a ΔVth).

FIG. 28 is a view showing the result of the simulation by investigating the variation in Vth (also called ΔVth) of the interference between the neighboring memory cells for the memory cells of the present invention and the comparison example. In FIG. 28, the horizontal axis shows Vth(V) while the vertical axis shows ΔVth(mv). In FIG. 28, the trapezoid plots (◆) shows the result of the conventional FG structure, the square plots (■) show the result of the ESCG structure as in the first embodiment, and the circle plots (●) show the result of the ESCG structure according to the eighth embodiment.

As can be seen from FIG. 28, the memory cell having the ESCG structure according to the eighth embodiment shows ΔVth that is remarkably-improved when compared with the case of the flash memory cell of the comparison example. The conventional FG structure of the comparison example cannot suppress the interference between the neighboring memory cells when the minimum machining size is reduced. The memory cell having the ESCG structure as in the first embodiment also shows the interference between the neighboring memory cells when Vth is low. In contrast with this, the memory cell having the ESCG structure according to the eighth embodiment can completely suppress the interference between the neighboring memory cells by the shield effect by the source/drain control gate 54. Thus, the memory cell according to the eighth embodiment can suppress the interference between the neighboring memory cells even when the minimum machining size is reduced.

Figure 29C:
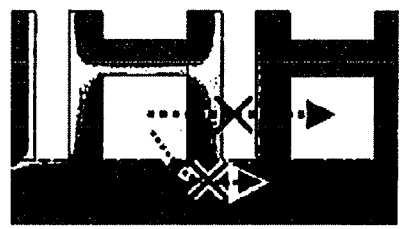
FIGS. 29(A) to 29(C) are views showing the result of the simulation of the interference between the neighboring memory cells for the memory cell of the present invention and the flash memory cell of the comparison example with regard to the potential distribution.
Figure 29B:
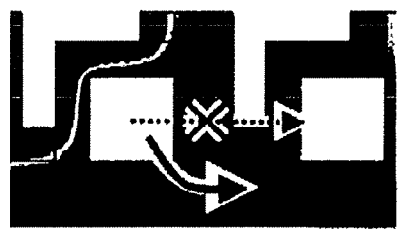
Figure 29A:

FIGS. 29(A) to 29(C) are views showing the potential distribution for the interference between the neighboring memory cells for the memory cells of the present invention and the comparison example. FIG. 29(A) shows the conventional FG structure. FIG. 29(B) shows the ESCG structure as in the first embodiment. FIG. 29(C) shows the result of the ESCG structure according to the eighth embodiment.

As can be seen from FIG. 29, the conventional FG structure of the comparison example shows, as shown in FIG. 29(A), an indirect influence from a neighboring floating gate to the floating gate of the selected cell. Thus, a reduced minimum machining size cannot suppress the interference between the neighboring memory cells. As shown in FIG. 29(B), the ESCG structure as in the first embodiment shows an interference issue having a direct influence from the floating gate of a neighboring cell to the channel region of the selected cell. In contrast with this, the memory cell having the ESCG structure according to the eighth embodiment of the present invention can, as shown in FIG. 29(C), completely suppress the interference between the neighboring memory cells by the complete shield effect by the source/drain control gate 54.

Ninth Embodiment

Figure 30:
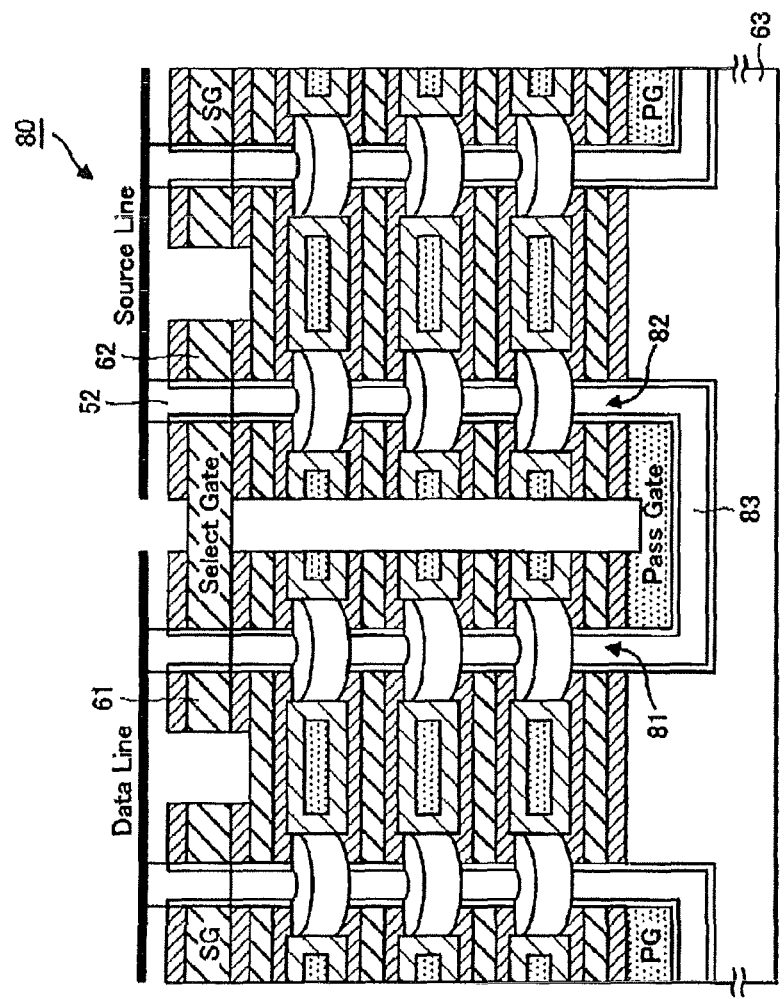
FIG. 30 is a schematic view illustrating the configuration of the memory cell according to the ninth embodiment of the present invention.

FIG. 30 is a schematic view illustrating the configuration of a memory cell string 80 according to the ninth embodiment of the present invention.

As shown in FIG. 30, the memory cell string 80 is configured so that left and right 3 bit memory cell strings 81 and 82 are configured as a pair by a pass transistor 83 and have a 6 bit memory capacity. The uppermost layer of the memory cell string 80 has the source line SL and the bit line (data line) BL. Furthermore, the lowermost layers of the left and right 3 bit memory cell strings 81 and 82 have the pass transistor 83. This pass transistor can use a vertical MOS transistor.

The first and second select gate transistors 61 and 62 shown in FIG. 30 are the same gates as the first and second select gate transistors 61 and 62 provided at the upper and lower sides of the memory cell string shown in FIG. 22A. The first and second select gate transistors 61 and 62 are a control gate to select the semiconductor pillar 52 connected to specific bit line and source line. Thus, data can be externally inputted to the semiconductor pillar 52 selected by the first and second select gate transistors 61 and 62 or data can be externally outputted from the semiconductor pillar 52. By the structure shown in FIG. 30, the wirings such as BL or SL can be formed at the upper side, thus simplifying the production.

Furthermore, the memory cell string 80 can simplify a multi-bit production method. Thus, the cell array control or a further-reduced area required for 1 bit can be achieved for example.

Tenth Embodiment

Figure 31:
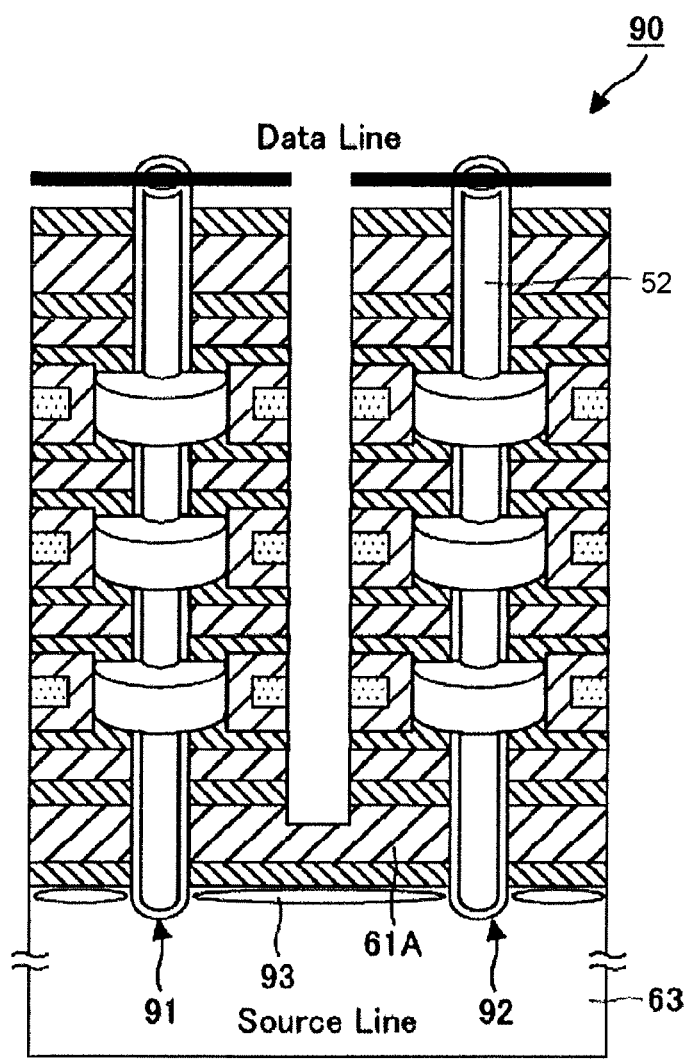
FIG. 31 is a schematic view illustrating the configuration of the memory cell according to the tenth embodiment of the present invention.

FIG. 31 is a schematic view illustrating the configuration of a memory cell string 90 according to the tenth embodiment of the present invention.

As shown in FIG. 31, the memory cell string 90 is configured so that two left and right 3 bit memory cell strings 91 and 92 share the first select gate transistor 61A provided at the lowermost side. The first select gate transistor 61A forms a source line inversion layer 93 between the gate oxidized film and the substrate 63.

Thus, the memory cell string 90 can prevent the short channel effect of the first select gate transistor 61A. Furthermore, no step is required to form the source line SL by a diffusion step for example. According to the memory cell string 90, the source line SL side is also electrically inverted. Thus, the production method can be simplified and the source line SL having a low resistance can be realized.

Eleventh Embodiment

FIGS. 32(A) to 32(D) are schematic views illustrating the configuration of a memory cell string 95 according to the eleventh embodiment of the present invention and the production method thereof.

As can be seen from FIGS. 32(A) to 32(D), in the memory cell strings 70, 80, and 90 of the eighth, ninth, and tenth embodiments, the floating gate 55 and the semiconductor pillar 52 are formed using single-crystal Si layers 96 and 97 by an epitaxial growth. The single-crystal Si layers 96 and 97 also can be formed independently instead of being simultaneously formed. The other procedures are the same as those described with reference to FIG. 23A to FIG. 23J and FIG. 24A to FIG. 24F.

In this manner, one of the most important issues for the current flash memory having the three-dimensional vertical layered structure (i.e., the variation in the threshold voltage and the deteriorated mobility characteristic caused by the trap charge in the poly Si semiconductor) can be improved.

The eighth to eleventh embodiments can be modified in various manners.

The floating gate also may, instead of circumferentially covering the side face of the semiconductor pillar to have an interval from the outer circumference of the semiconductor pillar, cover a part of the side face of the semiconductor pillar.

The main control gate also may, instead of circumferentially covering the floating gate via the insulating layer on the outer circumference of the floating gate, cover a part of the side face of the floating gate via the insulating layer on the outer circumference of the floating gate.

The source/drain control gate also may cover a part of the side face of the semiconductor pillar instead of circumferentially covering the side face of the semiconductor pillar via the insulating layer on the outer circumference of the semiconductor pillar at any or both of the upper face and the lower face of the floating gate. The source/drain control gate may be provided at any or both of the upper face and the lower face of the floating gate or may cover a part of the upper face and the lower face of the floating gate.

The present invention is not limited to the above embodiments and can be modified within the scope of the invention in the claims. Such modifications are also included in the scope of the present invention.

For example, in the first to seventh embodiments, the semiconductor pillar may be formed by single-crystal Si instead of poly Si.

What is claimed is:

1. A method of producing a semiconductor integrated circuit, comprising:
   a step of layering three types of different layers on a substrate;
   a step of forming an opening up to the surface of the substrate;
   a step of etching a region functioning as a floating gate in the layers layered adjacent to the opening;
   a step of depositing a semiconductor material in the opening including the region functioning as the floating gate;
   a step of subjecting a region including the deposited semiconductor material to an anisotropic etching to form an opening in a region in which a semiconductor pillar and a tunnel insulating layer are to be formed and to form the floating gate;
   a step of depositing a tunnel insulating layer on a side wall of the opening formed by the anisotropic etching;
   a step of depositing a semiconductor material on the opening surrounded by the tunnel insulating layer to form the semiconductor pillar;
   a step of etching the three types of different layers having etching selectivity to one another except for a layer including the floating gate and a layer functioning as a separation layer between cells;
   a step of forming another insulating layer on the floating gate, the layer functioning as the separation layer, and the tunnel insulating layer;
   a step of depositing, on the another insulating layer, a material to be used for a control gate; and
   a step of etching the material to be used for the control gate so as to form the control gate and a word line.

2. The method according to claim 1, wherein the step of forming the three types of different layers on the substrate is performed after a step of forming a source region or a drain region on a silicon substrate as the substrate or after a step of forming a pass transistor for connecting the semiconductor pillars provided adjacent to each other.

3. The method according to claim 1, wherein the semiconductor material is any one of poly silicon, silicon, metal, or silicide.

4. The method according to claim 1, wherein the material to be used for the control gate is any one of poly silicon, metal, or silicide.

5. A semiconductor integrated circuit in which a plurality of memory cells are serially-connected in an axial direction, comprising:
   a semiconductor pillar provided in the axial direction that serves as a channel;
   a floating gate that circumferentially covers the side face of the semiconductor pillar or covers a part of the semiconductor pillar to have an interval from the outer circumference of the semiconductor pillar;
   a control gate that circumferentially covers the side face of the semiconductor pillar or covers a part of the semiconductor pillar to have an interval from the outer circumference of the semiconductor pillar and that circumferentially covers the side face of the floating gate or covers a part of the floating gate to have an interval from the outer circumference of the floating gate;

a first insulating layer provided between the semiconductor pillar and the floating gate;

a second insulating layer provided between the floating gate and the control gate; and a third insulating layer provided between the semiconductor pillar and the control gate.

6. The semiconductor integrated circuit according to claim 5, wherein the floating gate and the control gate are provided to correspond to the each memory cell along the semiconductor pillar.

7. The semiconductor integrated circuit according to claim 5, wherein a side section of the semiconductor pillar opposed to the control gate has an inversion layer when a voltage is applied to the control gate to reduce the interference due to the parasitic capacitance caused between neighboring memory cells.

8. The semiconductor integrated circuit according to claim 5, a fourth insulating layer is provided between the control gate and the upper face or the lower face or a part of the upper face or the lower face of the floating gate.

9. The semiconductor integrated circuit according to claim 5, wherein the control gate is composed of a first control gate and a second control gate, the first control gate is circumferentially provided or provided at a part of the circumference around the floating gate via the second insulating layer, and the second control gate is circumferentially provided or provided at a part of the circumference around the semiconductor pillar via the third insulating layer.

10. The semiconductor integrated circuit according to claim 9, wherein the control gate is configured along the axial direction of the semiconductor pillar in an order of the first control gate and the second control gate, in an order of the second control gate and the first control gate, or in an order of the second control gate, the first control gate, and the second control gate.

11. The semiconductor integrated circuit according to claim 5, wherein at least one of the upper direction and the lower direction of the semiconductor pillar is connected to any one of a source line and a bit line, and hot electrons caused by a voltage application from the line enter the control gate and are not injected to the floating gate.

12. The semiconductor integrated circuit according to claim 10, wherein the control gate is configured in an integrated manner so that the second control gate sandwiches the first control gate along the axial direction of the semiconductor pillar.

13. The semiconductor integrated circuit according to claim 5, wherein a gap or a low-dielectric-constant layer is further inserted between the floating gate and the control gate adjacent to each other of the plurality of memory cells.

14. The semiconductor integrated circuit according to claim 5, wherein a plurality of the semiconductor pillars are provided on a substrate, a first select gate transistor is provided between the lowermost memory cell and the substrate, and a second select gate transistor is provided above the uppermost memory cell.

15. The semiconductor integrated circuit according to claim 5, wherein a plurality of the semiconductor pillars are provided on a substrate, and a pass transistor for connecting the semiconductor pillars adjacent to each other is formed on the substrate.

16. The semiconductor integrated circuit according to claim 14, wherein a plurality of the semiconductor pillars are provided on the substrate, a dummy control gate is provided between the lowermost memory cell and the first select gate transistor provided at the lowermost side or between the uppermost memory cell and the second select gate transistor provided at the uppermost side.

* * * * *